(12) United States Patent
Abraham et al.

(10) Patent No.: US 8,946,864 B2
(45) Date of Patent: Feb. 3, 2015

(54) SYSTEMS AND METHODS FOR PREPARING FILMS COMPRISING METAL USING SEQUENTIAL ION IMPLANTATION, AND FILMS FORMED USING SAME

(75) Inventors: Margaret H. Abraham, Portola Valley, CA (US); David P. Taylor, Hawthorne, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 13/049,762

(22) Filed: Mar. 16, 2011

(65) Prior Publication Data

US 2012/0235281 A1  Sep. 20, 2012

(51) Int. Cl.
  *H01L 29/02* (2006.01)
  *H01L 21/02* (2006.01)
  *H01L 29/207* (2006.01)
  *H01L 23/58* (2006.01)
  *H01L 21/265* (2006.01)
  (Continued)

(52) U.S. Cl.
  CPC .......... *H01L 21/26533* (2013.01); *C23C 14/10* (2013.01); *C23C 14/14* (2013.01); *C23C 14/48* (2013.01); *C23C 14/548* (2013.01); *C23C 14/5806* (2013.01); *H01L 21/26506* (2013.01); *H01L 21/268* (2013.01); *B81C 1/00507* (2013.01)
  USPC ............ 257/610; 257/607; 257/609; 257/643

(58) Field of Classification Search
  USPC ................. 438/406, 766, 162, 297, 407, 154; 257/607, E21.334, E29.002, 609, 610, 257/643
  See application file for complete search history.

(56) References Cited

U.S. PATENT DOCUMENTS

| | | | |
|---|---|---|---|
| 3,976,511 A | 8/1976 | Johnson et al. | |
| 4,517,226 A | 5/1985 | Baldi et al. | |

(Continued)

FOREIGN PATENT DOCUMENTS

| | | |
|---|---|---|
| CN | 1123340 A | 5/1996 |
| CN | 1348018 A | 5/2002 |

(Continued)

OTHER PUBLICATIONS

USPTO Notice of Allowance for U.S. Appl. No. 12/584,939, 8 pages (mailed May 9, 2012).

(Continued)

*Primary Examiner* — Khiem D Nguyen
*Assistant Examiner* — Wilner Jean Baptiste
(74) *Attorney, Agent, or Firm* — Jones Day; Jaime D. Choi

(57) ABSTRACT

Systems and methods for preparing films comprising metal using sequential ion implantation, and films formed using same, are provided herein. A structure prepared using ion implantation may include a substrate; an embedded structure having pre-selected characteristics; and a film within or adjacent to the embedded structure. The film comprises a metal having a perturbed arrangement arising from the presence of the embedded structure. The perturbed arrangement may include metal ions that coalesce into a substantially continuous, electrically conductive metal layer, or that undergo covalent bonding, whereas in the absence of the embedded structure the metal ions instead may be free to diffuse through the substrate. The embedded structure may control the diffusion of the metal through the substrate and/or the reaction of the metal within the substrate.

16 Claims, 23 Drawing Sheets

(51) Int. Cl.

| | |
|---|---|
| C23C 14/10 | (2006.01) |
| C23C 14/14 | (2006.01) |
| C23C 14/48 | (2006.01) |
| C23C 14/54 | (2006.01) |
| C23C 14/58 | (2006.01) |
| H01L 21/268 | (2006.01) |
| B81C 1/00 | (2006.01) |

(56) References Cited

U.S. PATENT DOCUMENTS

| | | | |
|---|---|---|---|
| 4,677,740 | A | 7/1987 | Shifrin et al. |
| 4,757,369 | A * | 7/1988 | Jackson et al. ............... 148/33.3 |
| 4,993,034 | A | 2/1991 | Aoki et al. |
| 5,133,757 | A | 7/1992 | Sioshansi et al. |
| 5,725,573 | A | 3/1998 | Dearnaley et al. |
| 5,822,347 | A | 10/1998 | Yokogawa et al. |
| 5,953,603 | A | 9/1999 | Kim |
| 6,432,844 | B1 * | 8/2002 | Farrar ............................ 438/783 |
| 6,472,109 | B2 | 10/2002 | Rolfson |
| 6,590,271 | B2 | 7/2003 | Liu et al. |
| 6,709,961 | B2 | 3/2004 | Noda |
| 6,753,240 | B2 | 6/2004 | Hayashida |
| 6,815,301 | B2 | 11/2004 | Shindo |
| 6,833,313 | B2 | 12/2004 | Hayakawa |
| 7,005,340 | B2 | 2/2006 | Hayashi |
| 7,012,274 | B2 | 3/2006 | Taylor |
| 7,056,816 | B2 | 6/2006 | Shibata |
| 7,170,083 | B2 | 1/2007 | Freeman et al. |
| 7,214,614 | B2 | 5/2007 | Chopra et al. |
| 7,419,915 | B2 | 9/2008 | Abraham |
| 7,419,917 | B2 | 9/2008 | Abraham |
| 7,510,786 | B2 | 3/2009 | Veerasamy et al. |
| 7,544,398 | B1 | 6/2009 | Chang et al. |
| 7,799,589 | B2 | 9/2010 | Akiyama et al. |
| 8,021,778 | B2 | 9/2011 | Snyder et al. |
| 8,158,532 | B2 | 4/2012 | Mayer et al. |
| 8,269,931 | B2 | 9/2012 | Abraham et al. |
| 8,309,438 | B2 | 11/2012 | Colombo et al. |
| 8,625,064 | B2 | 1/2014 | Abraham et al. |
| 2002/0182827 | A1 | 12/2002 | Abe et al. |
| 2003/0082882 | A1 | 5/2003 | Babcock et al. |
| 2003/0082892 | A1 | 5/2003 | Fan et al. |
| 2004/0082149 | A1 | 4/2004 | Sakaguchi et al. |
| 2004/0188725 | A1 * | 9/2004 | Fujiwara et al. ............... 257/288 |
| 2005/0186759 | A1 | 8/2005 | So |
| 2005/0250289 | A1 | 11/2005 | Babcock et al. |
| 2005/0250328 | A1 * | 11/2005 | Fujii ............................ 438/687 |
| 2006/0078024 | A1 * | 4/2006 | Matsumura et al. ........ 372/46.01 |
| 2006/0115965 | A1 | 6/2006 | Abraham |
| 2007/0217458 | A1 | 9/2007 | Kitano et al. |
| 2008/0073643 | A1 | 3/2008 | Ryu et al. |
| 2008/0197362 | A1 | 8/2008 | Hisamoto et al. |
| 2009/0020764 | A1 | 1/2009 | Anderson et al. |
| 2009/0032831 | A1 | 2/2009 | Akiyama et al. |
| 2009/0072243 | A1 * | 3/2009 | Suda et al. ....................... 257/77 |
| 2009/0078974 | A1 * | 3/2009 | Nagai et al. .................... 257/292 |
| 2009/0151429 | A1 * | 6/2009 | Jun et al. ...................... 73/31.06 |
| 2009/0242935 | A1 | 10/2009 | Fitzgerald |
| 2009/0273034 | A1 | 11/2009 | Woon et al. |
| 2010/0323113 | A1 | 12/2010 | Ramappa et al. |
| 2012/0003438 | A1 | 1/2012 | Appleton et al. |
| 2012/0049200 | A1 * | 3/2012 | Abraham et al. ............... 257/76 |
| 2012/0083103 | A1 * | 4/2012 | Shifren et al. ................ 438/530 |
| 2012/0301095 | A1 | 11/2012 | Abraham et al. |
| 2012/0312693 | A1 | 12/2012 | Veerasamy |

FOREIGN PATENT DOCUMENTS

| | | |
|---|---|---|
| DE | 19730296 | 1/1999 |
| EA | 1402 | 2/2001 |
| EP | 0363944 A | 4/1990 |
| ES | 2138884 | 1/2000 |
| GB | 2422246 A | 7/2006 |
| JP | 61-006319 A | 1/1986 |
| JP | 1-042564 A | 2/1989 |
| JP | 1-283824 A | 11/1989 |
| JP | 1-283825 A | 11/1989 |
| JP | 2-270974 A | 11/1990 |
| JP | 3-229854 A | 10/1991 |
| JP | 4-042920 A | 2/1992 |
| JP | 4-290429 A | 10/1992 |
| JP | 5-205616 | 8/1993 |
| JP | 6-056481 A | 3/1994 |
| JP | 6-132259 A | 5/1994 |
| JP | 8-274268 A | 10/1996 |
| JP | 2000-093503 | 4/2000 |
| JP | 2004-315876 A | 11/2004 |
| JP | 2006-000219 A | 1/2006 |
| JP | 2008-022696 A | 1/2008 |
| KR | 2004-0022639 | 3/2004 |
| WO | WO 98/26457 | 6/1998 |
| WO | WO 01/72104 A1 | 10/2001 |
| WO | WO 03/86496 A1 | 10/2003 |
| WO | WO 2005/043603 A2 | 5/2005 |

OTHER PUBLICATIONS

USPTO Office Action for U.S. Appl. No. 12/584,939, 10 pages (mailed Dec. 1, 2011).

Borders et al., "Formation of SiC in Silicon by Ion Implantation," Applied Physics Letters, vol. 18, No. 11, pp. 509-511 (Jun. 1, 1971).

Friedland et al., "Dependence of critical damage energies in diamond on electronic stopping," Surface and Coatings Technology, vol. 158-159, pp. 64-68 (2002).

Harbsmeier et al., "Epitaxial regrowth of C- and N-implanted silicon and α-quartz," Nuclear Instruments and Methods in Physics Research B, vol. 136-138, pp. 263-267 (1998).

Martin et al., "High-temperature ion beam synthesis of cubic SiC," J.Appl. Phys., vol. 67, No. 6, pp. 2908-2912 (1990).

Moore et al., "Laser micromachining of thin films for optoelectronic devices and packages," Laser Micromachining for Optoelectronic Device Fabrication, Proceedings of SPIE, vol. 4941, pp. 140-147 (2003).

Serre et al., "β-SiC on $SiO_2$ formed by ion implantation and bonding for micromechanics applications," Sensors and Actuators, vol. 47, pp. 169-173 (1999).

Terakado et al. "Modification of surface condition and irradiation effects of synchrotron radiation on photoexcited etching of SiC," J. Vac. Sci. Technol. A, vol. 13, No. 6, pp. 2715-2720 (1995).

Vickridge et al., "Limiting step involved in the thermal growth of silicon oxide films on silicon carbide," Physical Review Letters, vol. 89, No. 25, pp. 256102-1 to 256102-4 (2002).

Wong et al., "Infrared absorption spectroscopy study of phase formation in SiC layers synthesized by carbon implantation into silicon with a metal vapor vacuum arc ion source," Nuclear Instruments and Methods in Physics Research B, vol. 140, pp. 70-74 (1998).

U.S. Appl. No. 13/830,856, filed Mar. 14, 2013, Presser et al.

Belov et al., "Formation and 'White' Photoluminescence of Nanoclusters in SiOx Films Implanted with Carbon Ions," ISSN 1063-7826, Seminconductors, vol. 44, No. 11, pp. 1450-1456 (2010).

Chandrasekhar et al., "Strategies for the synthesis of highly concentrated Si1-yCy diamond-structured systems," Applied Physics Letters 72 (1998) 2117-2119.

Doolittle, Alan, "Lecture 5: Ion Implanation, Reading: Chapter 5," Georgia Tech.

Huang et al., "Growth of nearly one nanometer large silicon particles in silicon carbide and their quantum-confined photoluminescence features," Nanotechnology, vol. 18, 445605, pp. 1-5 (2007).

Jambois et al., "White electroluminescence from C- and Si-rich thin silicon oxides," Applied Physics Letters, vol. 89, No. 25, pp. 253124-1 to 253124-3 (2006).

Jambois et al., "Field effect white and tunable electroluminescence from ion beam synthesized Si- and C-rich SiO2 layers," Applied Physics Letters, vol. 91, No. 21, pp. 211105-1 to 211105-3 (2007).

Kantor et al., "Evolution of implanted carbon in silicon upon pulsed excimer laser annealing," Applied Physics Letters 69 (1996) 969-971.

Katharria et al., "Synthesis of buried SiC using an energetic ion beam," Journal of Physics D: Applied Physics 39 (2006) 3969-3973.

(56) References Cited

OTHER PUBLICATIONS

Krause et al., "Structure of silicon carbide precipitates in oxygen-implanted and annealed silicon-on-insulator material," Applied Physics Letters 53 (1988) 63-65.
Krumbein, Simeon, "Metallic Electromigration Phenomena," Presented at the 33$^{rd}$ Meeting of the IEEE Holm Conference on Electrical Contacts, Chicago, Illinois, Sep. 21-23 (1987).
Li et al., "Effects of post-annealing on Schottky contacts of Pt/ZnO films toward UV photodetector," Journal of Alloys and Compounds, 509(26):7193-7197 (Abstract only) (2011).
Nguyen et al., "Spectroscopic ellipsometry studies of crystalline silicon implanted with carbon ions," Journal of Applied Physics 67 (1990) 3555-3559.
Pellegrino et al., "Time-resolved analysis of the white photoluminescence from SiO2 films after Si and C coimplantation," Applied Physics Letters, vol. 84, No. 1, pp. 25-27 (2004).
Perez-Rodriguez et al., "White luminescence from Si+ and C+ ion-implanted SiO2 films," Journal of Applied Physics, vol. 94, No. 1, pp. 254-262 (2003).
Taylor et al., "Carbon precipitation in silicon: Why is it so difficult?" Applied Physics Letters 62 (1993) 3336-3338.
Tetelbaum et al., "Effect of carbon implantation on visible luminescence and composition of Si-implanted SiO2 layers," Surface and Coatings Technology 203, pp. 2658-2663 (2009).
USPTO Non-Final Office Action for U.S. Appl. No. 13/567,998, mailed Jan. 15, 2013, 12 pages.
Wong et al., "Cross-section transmission electron microscopy study of carbon-implanted layers in silicon," Applied Physics Letters 57 (1990) 798-800.
U.S. Appl. No. 14/086,826, filed Nov. 21, 2013, Abraham et al.
Di et al., "Thermal stability of diamondlike carbon buried layer fabricated by plasma immersion ion implantation and deposition in silicon on insulator," Journal Applied Physics, 98:053502 (2005).
Di et al., "Fabrication of silicon-on-Si $O_2$/diamondlike-carbon dual insulator using ion cutting and mitigation of self-heating effects," Journal Applied Physics, 88:142108 (2006).
USPTO Notice of Allowance for U.S. Appl. No. 13/567,998, 15 pages (mailed Sep. 19, 2013).
United States Patent and Trademark Office, final Office Action mailed Aug. 29, 2014, in related U.S. Appl. No. 14/086,826, filed Nov. 21, 2013.

* cited by examiner

SYSTEMS AND METHODS FOR PREPARING FILMS COMPRISING METAL USING SEQUENTIAL ION IMPLANTATION, AND FILMS FORMED USING SAME

FIELD OF THE INVENTION

This application generally relates to preparing films comprising metal using ion implantation, and films formed using ion implantation.

BACKGROUND OF THE INVENTION

It is well known to prepare films by implanting ions into a substrate. The implanted ions change the physical and/or electronic properties of the substrate. For example, implanting ions of an electron acceptor, such as boron (B), or an electron donor, such as phosphorous (P), into a silicon (Si) substrate can be used to modify the conductivity of selected regions of the substrate, thus enabling the fabrication of electronic structures such as transistors. It is also known to prepare buried films of silicon dioxide ($SiO_2$) by implanting oxygen (O) ions into an Si substrate. The substrate is subsequently annealed, during which covalent bonds form between the implanted O and the Si substrate to provide $SiO_2$. Buried films of $SiO_2$ prepared by ion implantation have been used, for example, as "barrier layers" that prevent electrical conduction between layers above and below the $SiO_2$.

It is further known to prepare buried films of metal silicide by implanting metal ions into an Si substrate using techniques described in U.S. Pat. Nos. 7,419,915 and 7,419,917 to Abraham, the entire contents of both of which are incorporated by reference herein.

Although films thus formed may in some circumstances be sufficient for conventional applications, the films may suffer from defects. For example, a film intended to be continuous may not actually be continuous, but instead may include large numbers of inclusions and clusters. Or, even if a film is continuous, the interface between the film and the substrate may not be smooth, but instead may include nodule growths. Additionally, it may be difficult, or impossible, to control the phase of the film, potentially resulting in suboptimal performance for a particular application. For example, different phases of a particular material may have drastically different physical, electrical, and/or thermal properties from one another.

Other failings of conventional processing include a limited choice of materials and a restricted range of potential changes to the substrate.

SUMMARY OF THE INVENTION

Embodiments of the invention provide systems and methods for preparing films comprising metal using sequential ion implantation, and films faulted using same.

In accordance with one aspect, an ion-implanted structure includes a substrate; an embedded structure formed within the substrate and having pre-selected characteristics; and a film within or adjacent to the embedded structure. The film may include a metal having a perturbed arrangement determined by the pre-selected characteristics of the embedded structure. Specifically, local or global changes to the substrate, induced by the embedded structure, produce a modified environment into which metal ions are implanted. These changes permit control over the structure and properties of the resulting film by changing the local chemical potential energy difference that would otherwise drive diffusion or reaction of the metal, by changing the kinetics of the transport process for the metal, or some combination of the two.

Specifically, the embedded structure may control and/or inhibit diffusion of the metal through the substrate, and also may control reaction of the metal within the substrate. For example, in the absence of the embedded structure, the metal may uncontrollably diffuse through the substrate, rendering the metal unsuitable for use as a conductive pathway. The embedded structure may control such diffusion by, for example, creating a region of relatively low chemical potential towards which the metal diffuses. Alternatively, the metal ions may be implanted within the embedded structure, which inhibits diffusion of the metal out of the embedded structure. Such control and/or inhibition of the diffusion process may cause the metal to coalesce into a substantially continuous, conductive, film. Additionally, the embedded structure may control reaction of the metal, e.g., by inhibiting reaction of the metal with another part of the substrate, or with contaminants such as water that may diffuse into the substrate. As described in further detail below, the shape of the metal film further may be controlled in all three dimensions using appropriate patterning and ion-implantation techniques, allowing for the preparation of well-defined electrically conductive pathways throughout the substrate.

The film may be formed by implanting metal ions into the substrate, for example into or adjacent to the embedded structure, or even at a spaced distance from the embedded structure. Additionally, the embedded structure may be formed by implanting ions of a second type into the substrate, the second type being different from the metal ions.

In some embodiments, the properties of the film may be controlled, for example, by adjusting the processing to which the embedded structure and/or the film are subjected. For example, if the embedded structure is annealed so as to faun a barrier layer before implanting the metal ions, the barrier layer may restrict diffusion of the metal ions into the substrate. The metal itself may alternatively form a barrier layer.

The film may be at least partially free-standing. The film may be fainted by implanting the metal ions at a first energy. The ion-implanted structure may further include a second film formed by implanting metal ions into the substrate at a second energy different from the first energy. The first film may include a first metal and the second film may include a second metal, different from the first metal. Alternatively, the film and the second film may include the same metal(s).

The ion-implanted structure of the present invention may have a cavity defined in the substrate. The cavity may expose a portion of the film and/or a portion of the embedded structure. The cavity may be disposed beneath the film and/or the embedded structure.

The metal may be selected from the group consisting of Al, Au, Ag, Mn. Cu, Pt, Li, Na, K, and Rb.

In accordance with another aspect, a method for preparing a film using ion implantation includes providing a substrate; embedding a structure within the substrate, the structure having pre-selected characteristics; and implanting metal ions within the substrate to faun a film having a perturbed arrangement determined by the pre-selected characteristics of the embedded structure.

In some embodiments, the metal ions are implanted within the embedded structure. In other embodiments, the metal ions are implanted adjacent to the embedded structure. In still other embodiments, the metal ions are implanted within the substrate and at a spaced distance from the embedded structure, and caused to diffuse through the thickness of the substrate toward the embedded structure so as to form the film.

The method may further include removing a portion of the substrate overlying the film and/or removing the embedded structure to at least partially expose the film and/or embedded structure. The embedded structure may control and/or inhibit diffusion of the metal through a thickness of the substrate. The method may include removing a portion of the substrate to define a cavity within the substrate.

Under still another aspect, a system for preparing a film using ion implantation includes an ion source; a stage; a database storing processing information about the film to be prepared, the stored information including information about a substrate, a structure embedded within the substrate, an ion type, and ion source and stage parameters for preparing the film by implanting metal ions of the ion type within or adjacent to the embedded structure; and a controller including a processor, a memory, an input device for receiving user input, and a display device for displaying information, and being in operable communication with the ion source, the stage, and the database. The controller, responsive to user input, obtains the processing information from the database, and responsive to that processing information, controls the ion source and stage in accordance with the parameters to prepare the film by implanting metal ions of the ion type within or adjacent to the embedded structure.

The embedded structure fabrication processes described herein may be used to make a variety of different devices, or arrays of devices, examples of some of which are provided herein. Other types of devices are possible.

DETAILED DESCRIPTION

Although ion implantation has been used for many years to prepare certain types of films, sequential ion implantation has not yet been exploited to prepare films having embedded metal films with tailored and well-controlled properties. The present inventors have recognized that the physical properties of a substrate may be methodically altered, e.g., by implanting ions of a first type, such that when ions of a second type are subsequently implanted, the resulting film has a desired set of physical properties that may be significantly different than those resulting from implantation of the second ions alone. That is, the presence of the previously implanted first type of ions modifies the behavior of the subsequently implanted second type of ions.

For example, an embedded structure may be formed within the substrate, e.g., by implanting ions of a first type. When ions of a second type, e.g., metal ions, are subsequently implanted into or adjacent to the embedded structure, that structure influences the behavior of the second type of ions compared to their behavior in the absence of the embedded structure, causing those ions to instead assume a perturbed arrangement. This perturbed arrangement of ions provides a different type of film than would otherwise form in the absence of the embedded structure. Without wishing to be bound by theory, it is believed that the embedded structure modifies the local environments experienced by the subsequently implanted ions, driving those ions to favor different kinetic and thermodynamic processes (including diffusion and nucleation) than they would without the embedded structure present. Moreover, the specific pressure created by the surrounding substrate and temperature changes created by heating can also modify the local environment of the implanted ions, allowing for further control. Thus, by controlling the characteristics of the embedded structure and the substrate, the properties of a film buried within, adjacent to, or even at a spaced distance from that embedded structure may be precisely controlled. For example, the transport properties and/or the reactive properties of the film may be controlled. As such, embodiments of the present invention enable the preparation of different types and configurations of films, and films of higher quality, than could otherwise be obtained using conventional ion implantation. Such improved films have numerous applications, including microelectromechanical systems (MEMS), microelectroopticalmechanical systems (MEOMS), nanoelectromechanical systems (NEMS), nanoelectroopticalmechanical systems (NEOMS), waveguides, photonic devices, plasmonic devices, sensors, and electronic devices, among others, as described in greater detail below.

Figure 1A:
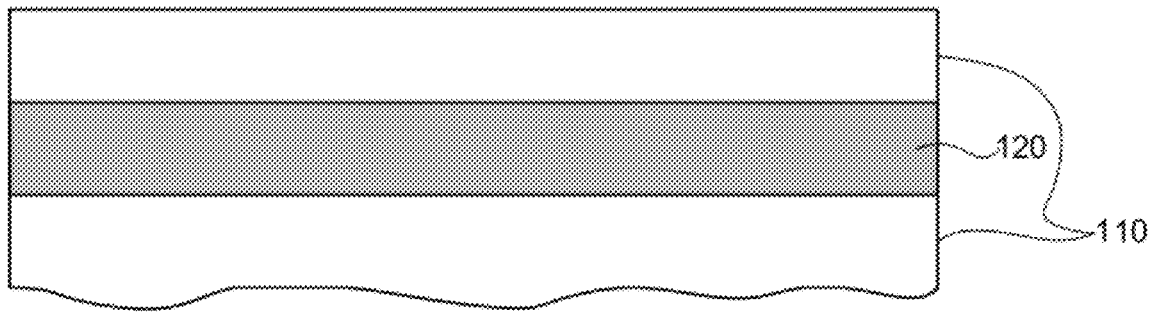
FIGS. 1A-1C illustrate cross-sectional views of exemplary structures that may be formed using previously known single ion implantation techniques.

To aid in understanding the preparation of films using sequential ion implantation, a brief description of the preparation of films using previously known single ion implantation techniques is provided with reference FIGS. 1A-1D, which illustrate cross-sectional views of exemplary structures that may be prepared using single ion implantation. FIG. 1A illustrates layer 120 of ions immediately following their implantation into substrate 110. Those of ordinary skill in the art will recognize that the concentration of implanted ions is not necessarily uniform throughout the thickness of layer 120, but instead may vary. For example, the ions may have a Gaussian distribution throughout the thickness of layer 120, with the greatest concentration of ions being approximately in the middle of layer 120. Such a Gaussian distribution may arise from a Gaussian distribution of the energies of at which the ions are implanted.

Figure 1B:
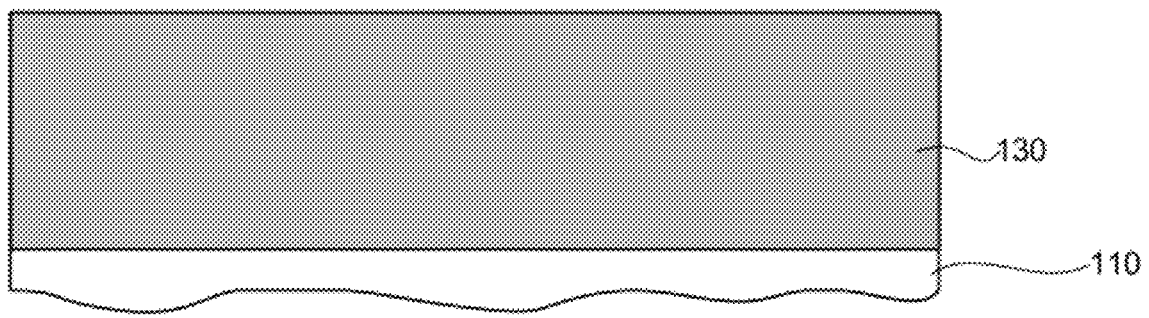

Depending on the chemical potential of the ions, they may subsequently undergo transport, diffuse or concentrate within the substrate over time, or upon subsequent processing such as heating or annealing. For example, as illustrated in FIG. 1B, ions from layer 120 may diffuse through substrate 110, providing layer 130 having increased thickness, and lower concentration, relative to layer 120. Metal ions tend to so diffuse, thus impeding ion implantation as a method of controllably preparing conductor layers. Layer 130 may extend through the entire thickness of substrate 110, or a portion thereof. The concentration of ions may be approximately uniform throughout the thickness of layer 130, or may be approximately Gaussian, or have a still different concentration profile, depending on the transport kinetics and extent to which the ions diffuse through the substrate, the type of processing performed, and the chemical potential between the ions and the substrate.

Figure 1C:
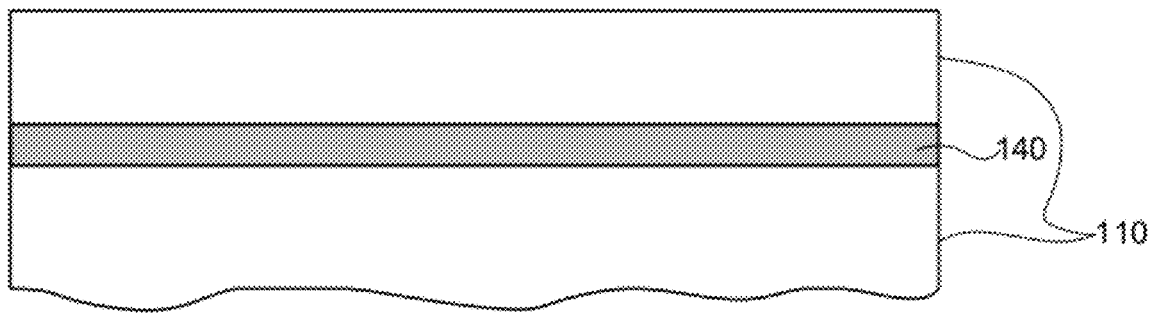

Alternatively, for example, as illustrated in FIG. 1C, the ions from layer 120 may concentrate within substrate 110, providing layer 140 having decreased thickness, and higher concentration, relative to layer 140. The concentrated ions in layer 140 may, for example, covalently or ionically bond to each other or to the substrate, or may cause other local changes to the substrate. One well-known example of such a change is the change in substrate conductivity induced by implanting an n- or p-type dopant. In one embodiment, the ions are monodispersed.

The tendency of ions in layer 120 to diffuse or concentrate within the substrate depends, among other things, on the compositions of the ions and the substrate, and the type of processing to which they are subjected following implantation, all of which affect the chemical potential energy environment of the implanted ions. Certain types of ions in a particular type of substrate may have relative chemical potential energy differences that drive the ions to diffuse through the substrate, while other types of ions in the same type of substrate may have chemical potential energy differences that drive the ions to instead aggregate. For example, certain types of metal ions implanted into Si are expected to diffuse upon annealing, while others are expected to concentrate. Or, for example, O ions implanted into Si are expected to concentrate upon annealing by bonding to Si in nucleation regions, from which $SiO_2$ grows epitaxially, whereas C ions implanted into Si are expected to concentrate upon annealing by bonding to Si to form a polycrystalline SiC film, the phase of which may be poorly controlled.

Figure 1D:
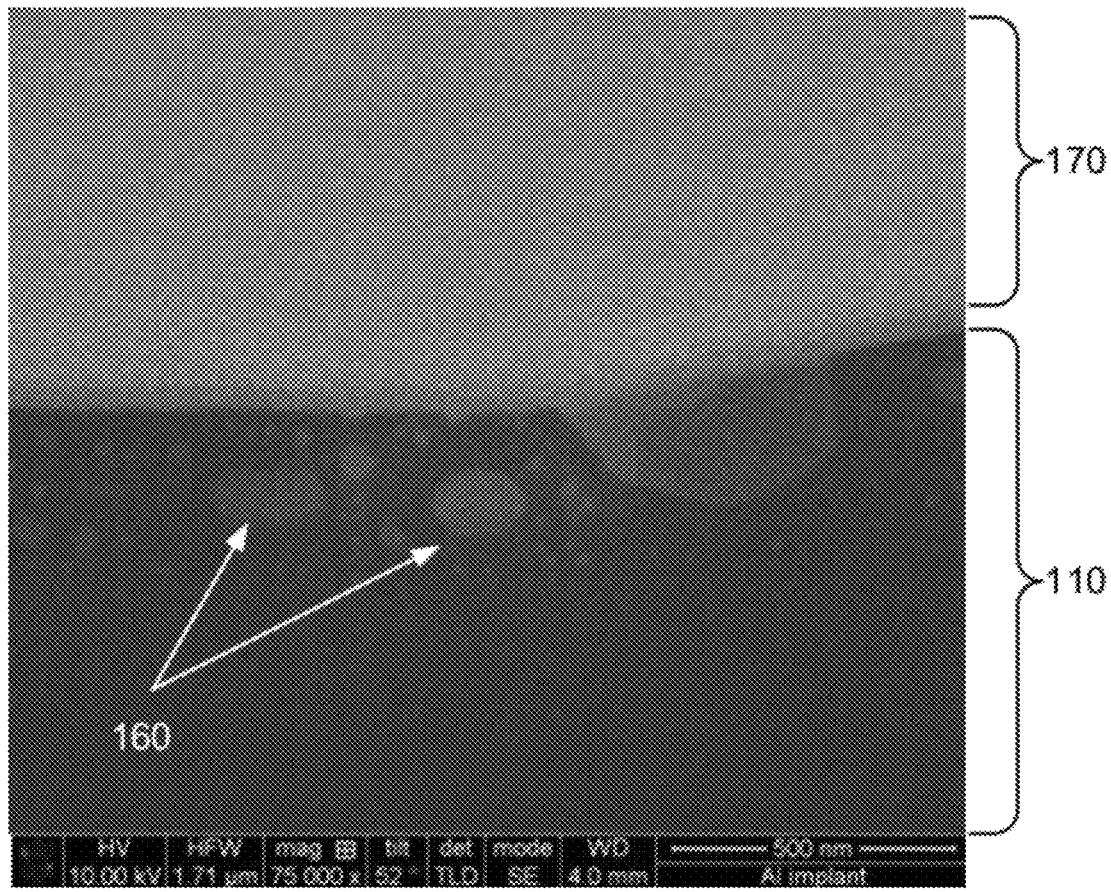
FIG. 1D is a scanning electron microscope (SEM) image of a film prepared using previously known single ion implantation techniques.

FIG. 1D is a scanning electron microscope (SEM) cross-sectional image of a structure prepared using previously known single ion implantation techniques. Specifically, aluminum ions were implanted into Si wafer 150. After implantation, the aluminum ions diffused through the thickness of Si wafer 150 and formed Al nodules 160. As will be appreciated by those skilled in the art, such nodules lack the physical continuity required to provide a commercially practicable conductive pathway through Si wafer 150. Layer 170 in FIG. 1D is a platinum layer added to the sample, following ion implantation, to facilitate SEM imaging.

The present invention provides sequential ion implantation techniques that may be used to alter the conventional behavior of ions, causing them to obtain perturbed arrangements, e.g., to control the extent and direction of the diffusion of implanted metal ions through the thickness of a substrate. FIGS. 2A-2E illustrate cross-sectional views of exemplary structures that may be formed using sequential ion implantation, according to some embodiments. In such structures, the chemical potential energy landscape of implanted metal ions is modified by the presence of an embedded structure that causes the subsequently implanted ions to favor a different kinetic or thermodynamic process than they would if the buried structure was absent. That is, the embedded structure modifies the chemical potential and local environment of the subsequently implanted metal ions. The change in chemical potential may, for example, reduce the tendency of the subsequently implanted metal ions to diffusively migrate, or may cause the ions to directionally migrate to a desired location, or even may drive the subsequently implanted ions to concentrate, e.g., to bond to each other, to the embedded structure, or to the substrate. The embedded structure may itself have been formed using ion implantation methods, as described in further detail herein.

Figure 2A:
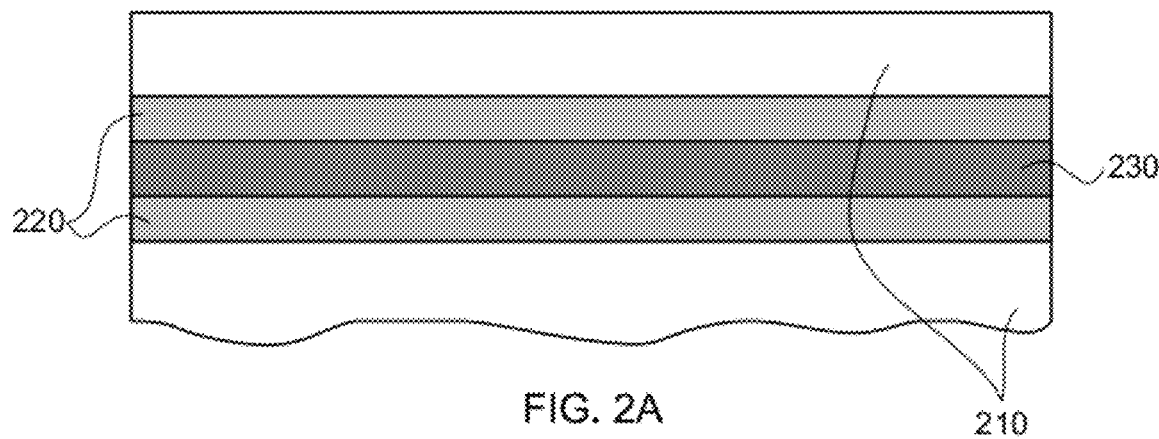
FIGS. 2A-2E illustrate cross-sectional views of exemplary structures that may be formed using sequential ion implantation, according to some embodiments.

Referring now to FIG. 2A, substrate 210 includes embedded structure 220 into which a layer of metal ions 230 is implanted. In one embodiment, embedded structure 220 may, for example, include ions of a first type that were implanted and, following further processing (e.g., annealing), bonded to the substrate 210 or to each other. In an alternative embodiment, embedded structure 220 is formed in substrate 210 by providing two or more substrates having ions of the first type, e.g., oxides, on a surface of each substrate and coupling the surfaces together such that the ions bond using techniques known in the art such as the smart crack system.

Layer 230 is faulted by implanting metal ions into embedded structure 220. Examples of suitable metals include Al, Au, Ag, Mn, Cu, and Pt, as well as the alkali metals, including Li, Na, K, and Rb. Embedded structure 220 impedes transport of the metal ions of layer 230 into substrate 210. For example, embedded structure 220 may impede defect diffusion, grain boundary diffusion, or lattice diffusion of the metal ions of layer 230. For example, embedded structure 220 may inhibit or prevent the metal ions of layer 230 from diffusing both upwards and downwards, i.e., through the thickness of substrate 210, and optionally also may inhibit or prevent the ions of layer 230 from diffusing laterally. In other embodiments, the metal ions of layer 230 may be able to laterally diffuse, allowing them to form a substantially uniform and continuous metal film within embedded structure 220. Additionally, embedded structure 220 may inhibit reaction of the metal ions. For example, Au, Li, N, K, and Rb are reactive metals, with the alkali metals being particularly reactive. As such, their commercial practicability has been somewhat limited. Embedded structure 220 may reduce the reactivity of the metal ions of layer 230, for example by constraining the location of the metal ions with respect to other reactants (e.g., the substrate, or water or oxygen that diffuses into the substrate). Although not illustrated, one or more further passivating layers may be added to the top surface of substrate 210 to further reduce the possibility of reactants diffusing into the substrate.

Because embedded structure 220 inhibits the motion and/or reactivity of the ions of layer 230, the ions of layer 230 may attain a perturbed arrangement. For example, the constraint imposed by structure 220 may cause the ions of layer 230 to form a substantially continuous, electrically conductive, metallic layer. Alternatively, the constraint imposed by structure 220 may cause the ions of layer 230 to covalently or ionically bond to each other, to structure 220, and/or to substrate 210, which bonding would not otherwise have occurred in the absence of structure 220. The resulting material may be a conductor, a semiconductor, or an insulator, depending on the particular characteristics of the ions, embedded structure, and substrate. The constraint imposed by structure 220 further may cause the ions of layer 230 to obtain a particular thermodynamic phase, e.g., a crystalline lattice (of which there may be many arrangements) or an amorphous phase. Thus, embedded structure 220 causes layer 230 to exhibit different properties than if structure 220 was absent (e.g., as illustrated in FIG. 1C). It should be noted that layer 230 need not be centered symmetrically within embedded structure 220, but may be located anywhere in the thickness of structure 220.

Figure 2B:
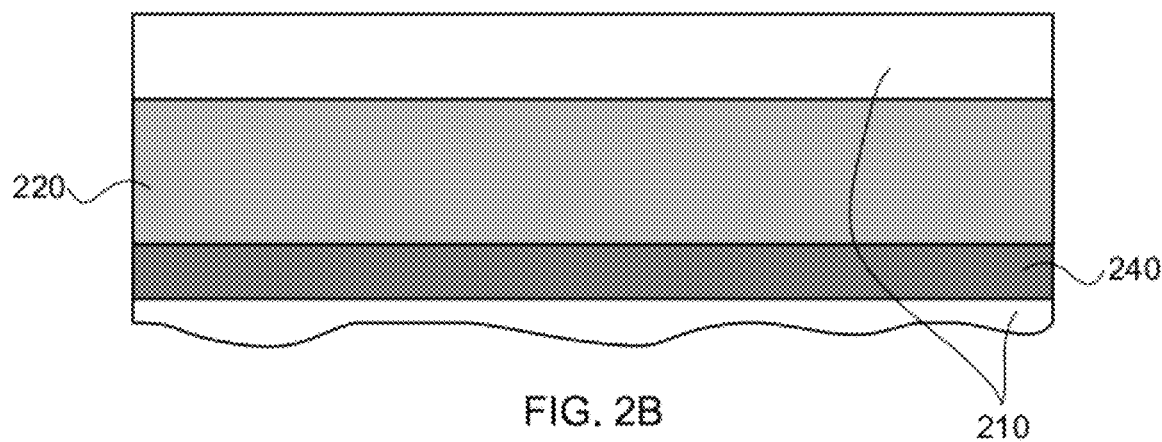
Figure 2C:
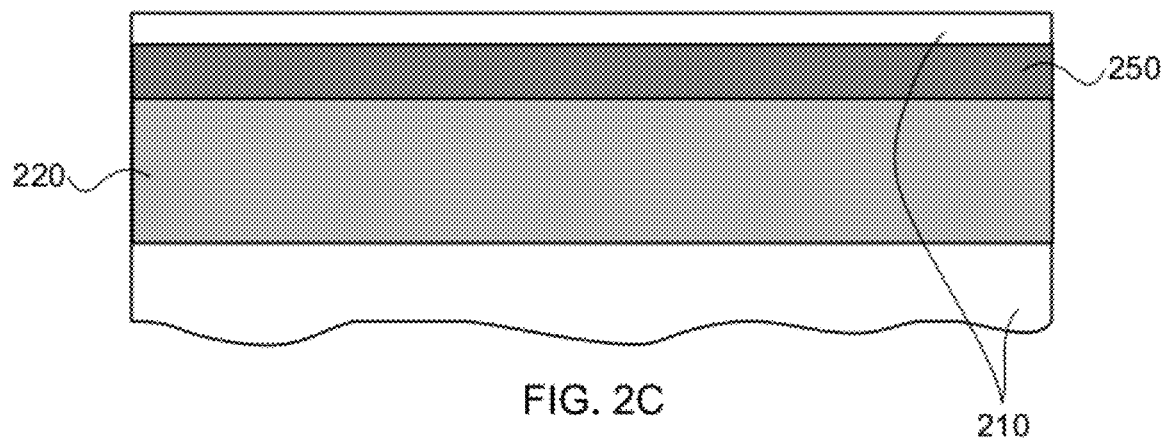
Figure 2D:
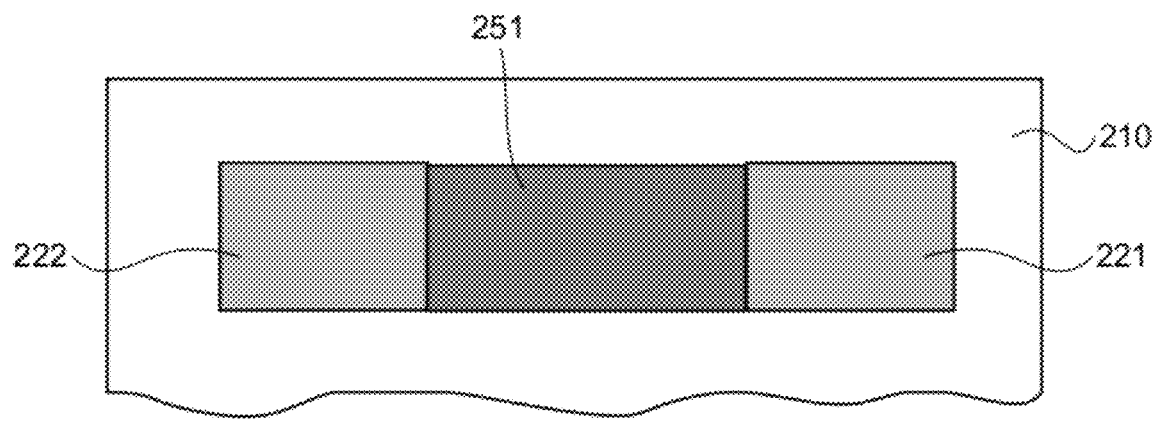
Figure 2E:
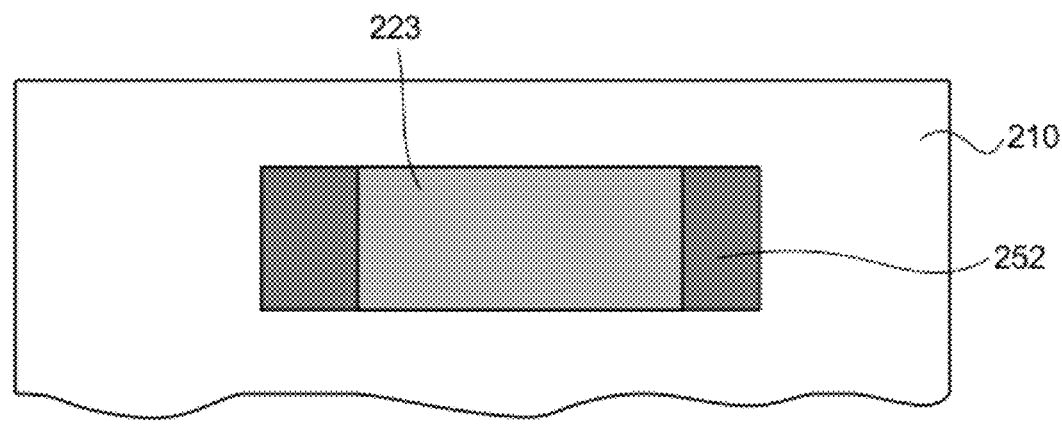

Alternatively, as illustrated in FIG. 2B, layer 240 of subsequently implanted metal ions may be positioned adjacent to, and immediately below, embedded structure 220, or, as illustrated in FIG. 2C, layer 250 of subsequently implanted metal ions may be positioned adjacent to, and immediately above, embedded structure 220. Note, however, that the metal ions need not necessarily have been implanted in this position, but instead may have been implanted at a spaced distance from embedded structure 220 and subsequently directionally diffused toward the embedded structure due to the chemical potential landscape.

In the embodiment of FIG. 2B, structure 220 may inhibit or prevent the ions in layer 240 from diffusing upwards, whereas in the embodiment of FIG. 2C, structure 220 may inhibit or prevent the metal ions in layer 250 from diffusing downwards. In the embodiments of FIGS. 2B and 2C, structure 220 causes an asymmetrical modification to the chemical potentials of the metal ions of layers 240 and 250, causing those ions to assume a perturbed arrangement, e.g., to diffuse and/or react differently than if they were instead embedded within structure 220 (e.g., as illustrated in FIG. 2A), or embedded directly in substrate 210 (e.g., as illustrated in FIG. 1C). For example, embedded structure 220 may attract the ions of layer 240 or 250, causing those ions to directionally diffuse toward an interface between structure 220 and 240 or 250, where they may coalesce into a substantially continuous metal film or may covalently or ionically bond with each other or with the substrate, and/or form a particular thermodynamic phase, such as a crystalline lattice or amorphous phase.

It should be understood that although some embodiments described herein pertain to modifying the behavior of implanted ions vertically, that is, through the thickness of the substrate, the structures and methods apply equally to modifying the behavior of the implanted ions laterally. For example, in the embodiment of FIG. 2D, embedded structures 221, 222 may inhibit or prevent the metal ions in layer 251 from diffusing laterally, analogously to the embodiment shown FIG. 2A but constraining diffusion in the lateral dimension instead of the vertical dimension. Or, for example, in the embodiment of FIG. 2E, embedded structure 223 may attract the metal ions in layer 252, analogously to the embodiment shown in FIGS. 2B and 2C, but attracting the ions in the lateral dimension instead of the vertical dimension.

In some embodiments, two or more different types of ion may be sequentially implanted to form layer 230, 240, or 250, and the ions may alloy with each other or may bond with each other, with the embedded structure, and/or with the substrate to form a complex species, e.g., a species comprising three or more different types of atoms. In one example, two different types of ion are implanted, and bond to the substrate or to the embedded structure, to form a ternary species.

Other configurations are possible. For example, as elaborated below, the embedded structure and/or the film may be patterned to provide a device having a desired physical, electrical, and/or thermal functionality. Or, for example, the embedded structure and/or the film may be located at varying locations through the depth of the substrate. In some embodiments, the embedded structure is located at the top surface of the substrate, such that there is no intervening layer of substrate over the embedded structure. In other embodiments, the embedded structure is buried within the substrate, and the film is positioned over the embedded structure and fills substantially the entire volume between the embedded structure and the top surface of the substrate, such that there is no intervening layer of substrate over the film.

Figure 3:
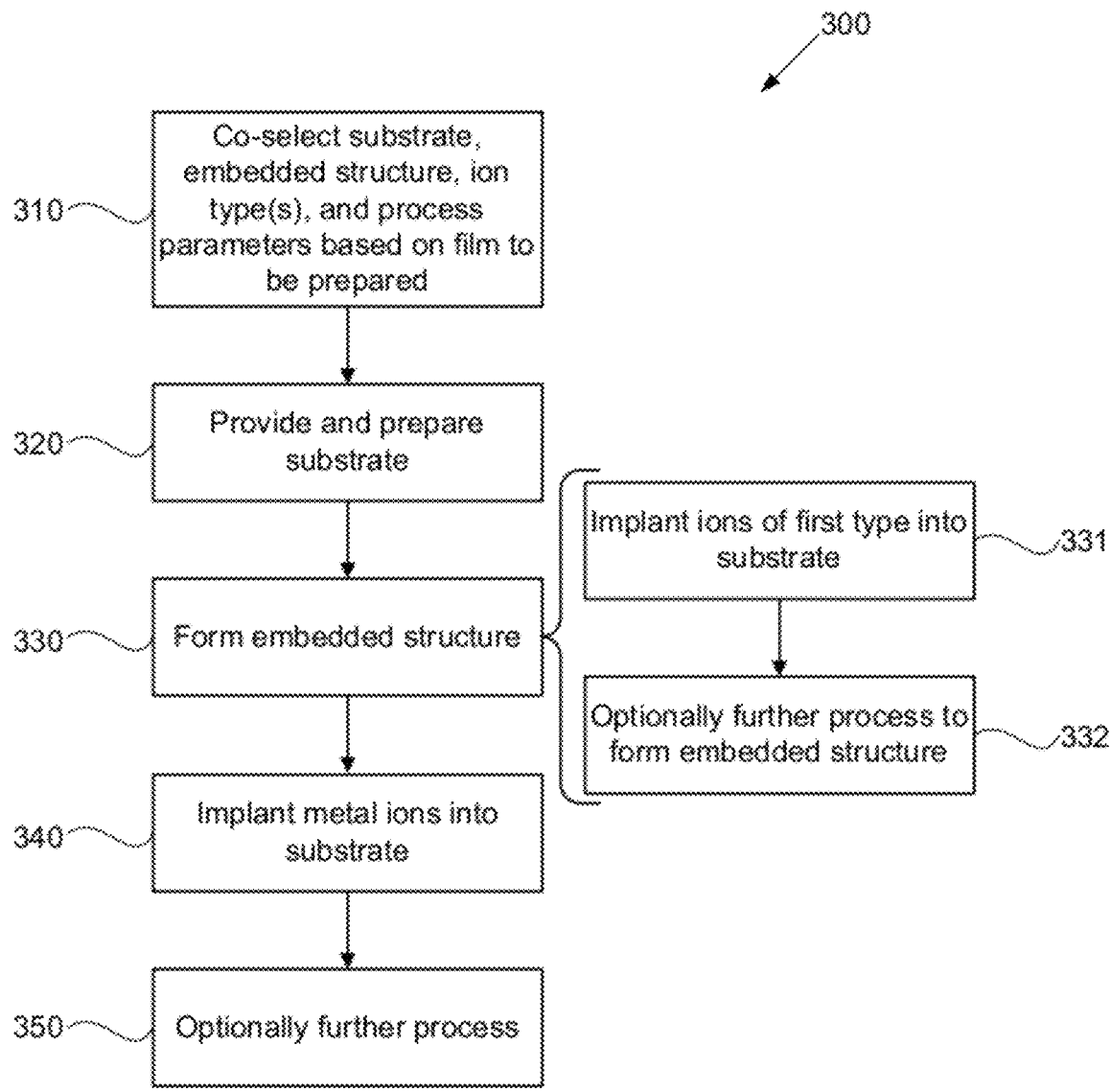
FIG. 3 is a flow chart of steps in an illustrative method for preparing a film comprising metal using sequential ion implantation, according to some embodiments.

FIG. 3 illustrates an overview of an exemplary method 300 for preparing a film, e.g., for preparing layer 230, 240, or 250 described above, using sequential ion implantation, and FIGS. 4A-4F illustrate exemplary structures that may be formed using such a method.

With respect to FIG. 3, based on a film type to be prepared, a substrate, an embedded structure (which may itself be prepared using ion implantation), ion type(s), and process parameters are co-selected (310). Specifically, the substrate, embedded structure, and processing parameters associated therewith are co-selected to modify the physical properties of the substrate such that, when the metal ions are later implanted into or adjacent to the embedded structure, and optionally further processed, the metal ions obtain a desired perturbed arrangement and thus form the desired type of film.

The selected processing parameters include ion implantation doses and energies, and any additional (e.g., non-ion implantation) processing to be performed. The doses and energies are selected to provide appropriate stoichiometric ratios between the implanted ions, the substrate, and the embedded structure for preparation of the desired film. The additional processing is selected to encourage the appropriate interactions between the metal ions, the embedded structure, and the substrate, for example, to encourage a predetermined amount of diffusion to occur, to encourage covalent bonds to form, or to encourage nucleation of ions into a particular thermodynamic phase, e.g., a crystalline lattice or an amorphous phase.

Then, the selected substrate is provided and prepared (320). Non-limiting examples of suitable substrates include silicon, germanium, gallium phosphide, gallium nitride, gallium arsenide, and indium phosphide. The substrate may, for example, be a wafer, e.g., a single-crystal wafer, or may be a film disposed on a solid support such as glass or sapphire. The substrate may be monocrystalline, and optionally may have a particular crystalline orientation. For example, Si substrates are available in various crystallographic orientations, such as [100] or [111], either of which may be suitable. Alternatively, the substrate may be polycrystalline, or even amorphous.

Figure 4A:
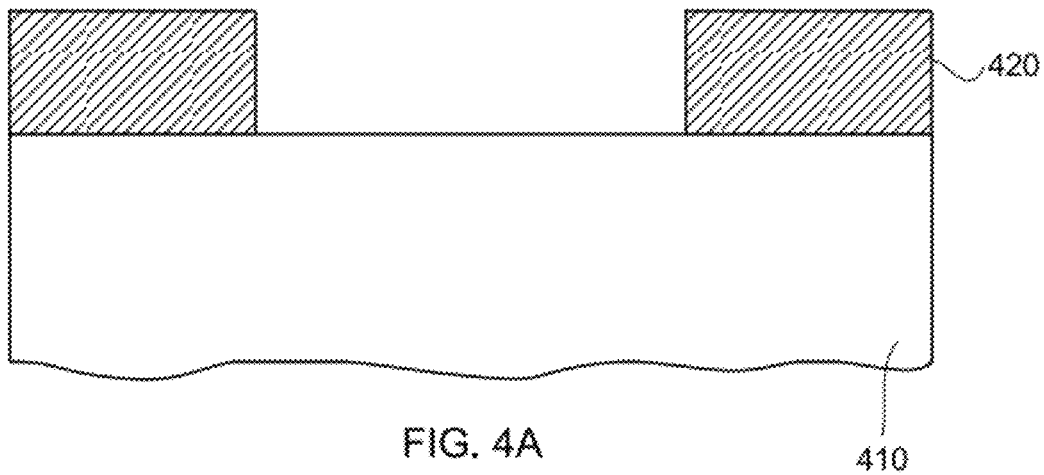
FIGS. 4A-4F illustrate cross-sectional views of structures that may be formed while preparing a film using sequential ion implantation, according to some embodiments.

Depending on the desired application of the film to be prepared, it may be desired to form the embedded structure in accordance with a pattern. If so, the substrate may be prepared to include a patterned mask that defines regions in which the embedded structure is to be formed. For example, if the embedded structure is to be formed by implanting ions of a first type, the patterned mask may substantially prevent those ions from becoming implanted anywhere other than in desired regions. For example, as illustrated in FIG. 4A, a patterned mask 420 may be provided on the upper surface of substrate 410 using techniques well-known in the art, e.g., using deposition and lithographic patterning. Mask 420 may inhibit or prevent ions of the first type from penetrating into the regions of substrate 410 upon which it is disposed, and thus may define the lateral features of the embedded structure 440 to be prepared during later steps. Alternatively, directed ion beams may be used to implant ions in accordance with a desired pattern, thus obviating the need to use a patterned mask. In still other embodiments, the embedded structure is to be substantially uniform across the entirety of substrate 410, in which case no pattern need be defined. Thus, although the embodiments described below utilize a patterned mask, it should be clear that masks are optional.

The embedded structure is then formed (330). In many embodiments, and in the examples provided below, the embedded structure is formed by implanting ions of a first type into the substrate (331) and then optionally further processing the substrate to form the embedded structure (332). Forming embedded structures using ion implantation may be convenient because a relatively low number of processing steps are required, and in some circumstances the substrate may remain in place during the formation both of the embedded structure and desired film. However, it should be clear that embedded structures may also be formed using other suitable methods, such as any suitable combination of conventional photolithography, chemical vapor deposition, sputtering, electroplating, and the like. The embedded structures thus formed may still modify the chemical potential energy environment of the subsequently implanted ions. Indeed, embedded structures formed using different methods, but having comparable compositions, may themselves have subtle structural differences. As such, ions implanted into embedded structures formed using different methods may have different chemical potentials and thus form films having different characteristics from one another. Thus, selection of the particular method by which the embedded structure is formed may provide still further control over the characteristics of the film formed using the subsequently formed ions. One example of a suitable method for preparing an embedded structure includes treating a specified region of the substrate with a laser to locally anneal that region, thus modifying its properties, the modified region constituting the embedded structure. Or, for example, an oxide or nitride may be deposited onto the substrate, and ions may diffuse out of that oxide or nitride and into a local region of the substrate to form the embedded structure. Any other suitable method alternatively may be used.

Figure 4B:
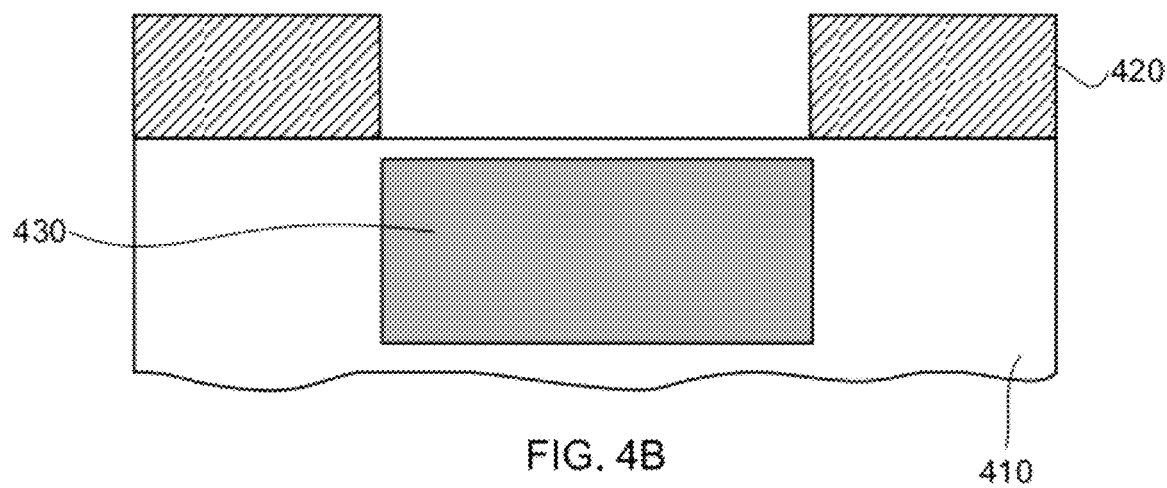

In embodiments in which the embedded structure is formed using ion implantation, some non-limiting examples of suitable ions implanted in step 331 include O, H, C, and N. As illustrated in FIG. 4B, the first ion type may form layer 430 within substrate 410 having lateral dimensions defined by mask 420. The depth and thickness of the layer 430 is based, among other things, upon the energy of the first ion type, and the distribution of that energy. The substrate 410 may also be heated during this step to reduce damage to the substrate caused by the ion implantation, by annealing dislocations caused by ions as they pass through the substrate.

The depth and thickness of the implanted layer may vary depending on the desired characteristics of the film to be subsequently prepared. However, practical considerations may constrain the depth to which the ions may be implanted. For example, an ion source capable of generating energies on the order of keV may only be capable of implanting ions to a depth of about 1 µm or less, whereas an ion source capable of generating greater energies may be capable of implanting ions to a greater depth. In some embodiments, the ions are implanted to a depth of between 10 nm and 10 µm, or between 10 nm and 5 µm, or between 10 nm and 1 µm, or between 50 nm and 500 nm, or between 1 µm and 5 µm, or between 5 µm and 10 µm, or some other depth. In some embodiments, the thickness of the implanted layer of ions is between 10 nm and 1 µm, or between 10 nm and 500 nm, or between 10 nm and 200 nm, or between 10 nm and 100 nm, or between 10 nm and 50 nm, or between 50 nm and 100 nm, or between 1 nm and 10 nm, or between 1 nm and 5 nm. Additionally, as is known to those of skill in the art, thicker layers may be prepared using multiple implantations of the same type of ion with varying energies, to penetrate further or shallower within the substrate.

Figure 4C:
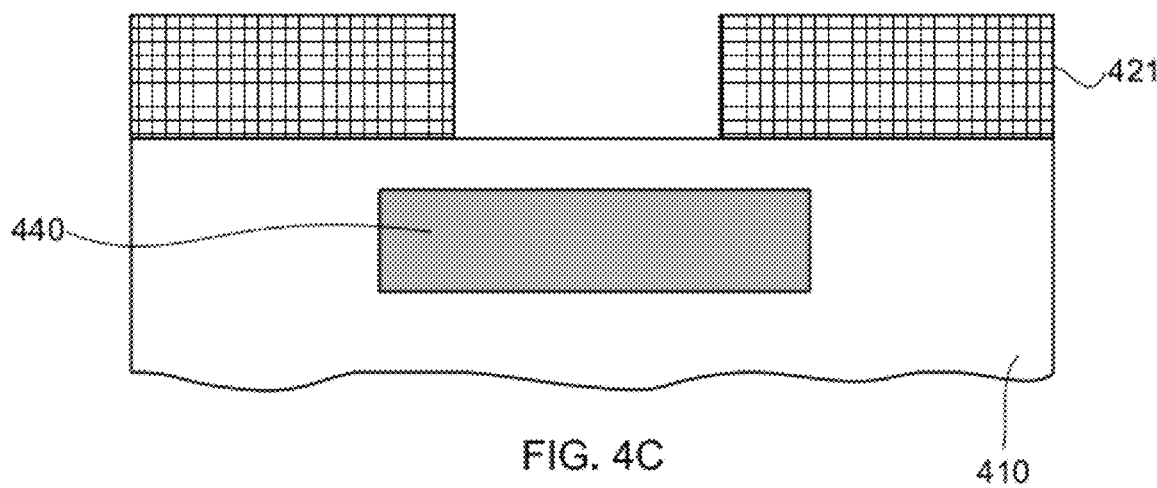
Figure 4D:
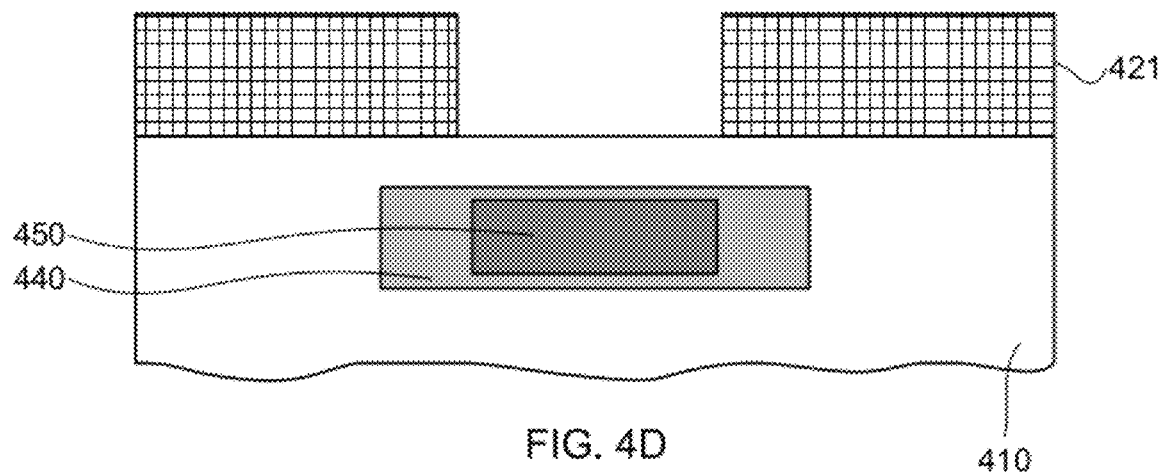
Figure 4E:
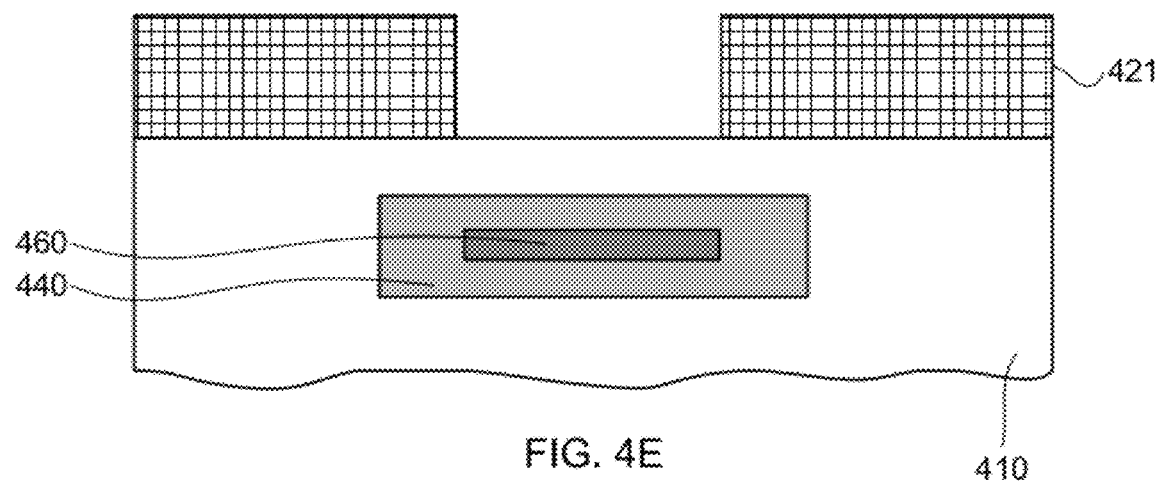

After implanting the ions of the first type into the substrate, the substrate is then further processed to form the embedded structure (332). For example, the substrate may be annealed, causing the ions of the first type to concentrate, e.g., to bond to the substrate or to nucleate. As illustrated in FIG. 4C, such further processing may cause layer 430 to contract into embedded structure 440 that is thinner than layer 430 and in which the ions of the first type are bonded to the substrate. For example, if the substrate is Si and the first ion type is O, then an anneal step may be used to cause the implanted O ions to bond to the Si substrate to form an embedded $SiO_2$ structure. In other embodiments, further processing may not be required to form an embedded structure; that is, further processing step 340 may in some cases be optional. Another example of intermediate processing is defining a pattern with which the ions of the second type will be implanted into the substrate. For example, mask 420 may be removed and mask 421 having a different pattern may be provided on substrate 410. In the embodiment illustrated in FIG. 4C, mask 421 defines a smaller aperture than did mask 420, so the second ion type will be implanted with a smaller lateral dimension than has embedded structure 440. In alternative embodiments, the embedded structure is formed using patterning but the subsequently prepared film is prepared without patterning, or the embedded structure is formed without patterning but the subsequently prepared film is prepared using patterning.

The metal ions are then implanted into the substrate (340). For example, in some embodiments, the metal ions are implanted directly into the embedded structure. In other embodiments, the metal ions are implanted adjacent to the embedded structure, e.g., either directly above or directly below the embedded structure. In still other embodiments, the metal ions are implanted at a spaced distance from the embedded structure.

Non-limiting examples of suitable metal ions include aluminum (Al). In the embodiment illustrated in FIG. 4D, the metal ions are implanted within embedded structure 440, and form a layer 450 that is buried substantially entirely within the embedded structure 440. Other exemplary configurations for layers formed using metal ions are described further below with reference to FIGS. 5A-7D. The lateral dimensions of layer 450 are defined by mask 421, and the thickness and depth are defined by the dose and energy with which the metal ions are implanted. Additionally, the presence of embedded structure 440 may reduce or increase the amount of energy required to implant layer 450 at the desired depth. For example, if the embedded structure 440 includes $SiO_2$, then the amount of energy required to implant layer 450 within structure 440 may be reduced due to the characteristics of the $SiO_2$. The substrate may also be heated during this step to reduce damage to the substrate and/or to the embedded structure 450 caused by dislocations generated by ions passing through the substrate or embedded structure, as mentioned above. In some embodiments, the ions are implanted to a depth of between 10 nm and 10 µm, or between 10 nm and 5

μm, or between 10 nm and 1 μm, or between 50 nm and 500 nm, or between 1 μm and 5 μm, or between 5 μm and 10 μm, or some other depth. In some embodiments, the thickness of the implanted layer of ions is between 10 nm and 1 μm, or between 10 nm and 500 nm, or between 10 nm and 200 nm, or between 10 nm and 100 nm, or between 10 nm and 50 nm, or between 50 nm and 100 nm, or between 1 nm and 10 nm, or between 1 nm and 5 nm. Additionally, as mentioned above, multiple implantations of the ions of the second type, using varying energies may be used to create thicker layers as appropriate.

Figure 4F:
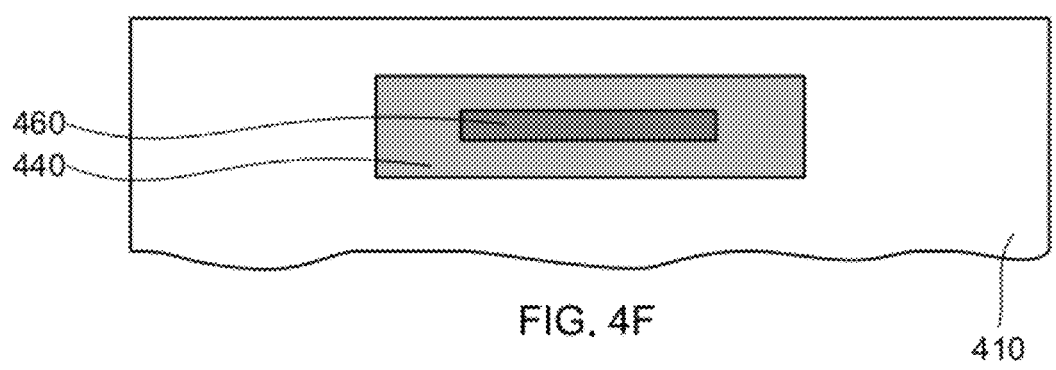

The substrate, with the embedded structure and the metal ions implanted therein, is then optionally further processed (350). In some embodiments, the substrate may be annealed, which may cause the metal ions to diffuse in a pre-selected direction based on the chemical potentials of the substrate and the embedded structure. For example, in embodiments in which the metal ions are implanted in the substrate at a spaced distance from the embedded structure, annealing may cause the metal ions to diffuse towards an interface between the substrate and the embedded structure. There, the metal ions may coalesce at the interface into a substantially continuous metal film. Alternatively, such annealing may cause the metal ions to concentrate, e.g., to bond to each other, to the embedded structure if implanted therein, or to the substrate, and/or to arrange into a particular thermodynamic phase, such as a crystalline lattice or amorphous phase. In some embodiments, absent the embedded structure, the metal ions would instead tend to diffuse through the substrate upon annealing. In the embodiment illustrated in FIG. 4E, layer 440 physically constrains layer 450, causing the metal ions to assume a perturbed arrangement, in which they concentrate into layer 460, i.e., the desired layer to be formed, which is buried within structure 440. Layer 460 may then be used as it is, or may be still further processed, e.g., to remove mask 421, as illustrated in FIG. 4F.

A variety of films may be formed using the method of FIG. 3. The films may be continuous, smooth, electrically conductive, and/or have substantially a single phase, whereas conventionally formed films may suffer from discontinuities, have nodule growths causing surface roughness, reduced electrical conductivity, and poor or no phase control. Additionally, the method of FIG. 3 may be used to form films having any desired lateral dimension by patterning the ions being implanted, e.g., using masks or a patterned ion beam, and further having any desired vertical dimension by controlling the dose and energy of the ions as they are implanted.

Unlike previously known films, the films comprising metal provided herein are not limited to deposition onto the surface of a substrate, but instead may be prepared at any desired depth inside of the substrate, and in any desired pattern. As such, the films may provide functionalities not previously attainable, such as providing a barrier layer, a conductor layer, a semiconductor layer, and/or a thermally conductive layer within the substrate. Additionally, the films comprising metal provided herein may have essentially only a single phase across the film. Such a phase may develop if the film is annealed at an appropriate temperature after metal ion implantation. The apparatus used to implant the ions, e.g., the ion accelerator, may also enable various other sorts of selectivity. For example, an isotope of selected weight may be selected using a mass spectrometer, and then implanted.

Embedded films comprising metal further may be used as an embedded structure to control the preparation of films formed during a subsequent ion implantation process. That is, a film comprising metal may be used as the embedded structure of step 330 in FIG. 3, and a new layer of ions implanted within, adjacent to, or at a spaced distance from the film comprising metal. These subsequently implanted ions may be metal, or may be a non-metal.

A structure such as that illustrated in FIG. 4F may be used for a variety of purposes. For example, the patterns of the embedded structure 440 and layer 460 may easily be defined using only masks 420, 421, or even by omitting masks and instead patterning the ion beams, allowing for the formation of an insulated conductor having any appropriate pattern without the need for complex processing. In some embodiments, for example, if layer 460 need not have smaller lateral dimensions than embedded structure 440, then mask 420 or the same ion beam pattern may be used during the preparation both of the embedded structure and layer 460, further simplifying the preparation of layer 460.

Figure 5A:
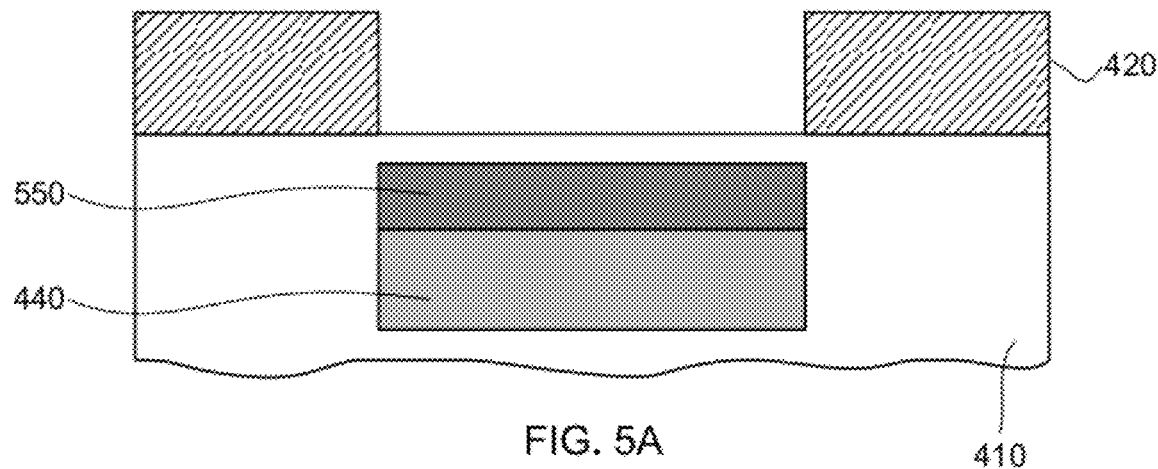
FIGS. 5A-5E illustrate cross-sectional views of alternative structures that may be formed while preparing a film using sequential ion implantation, according to some embodiments.
Figure 5B:
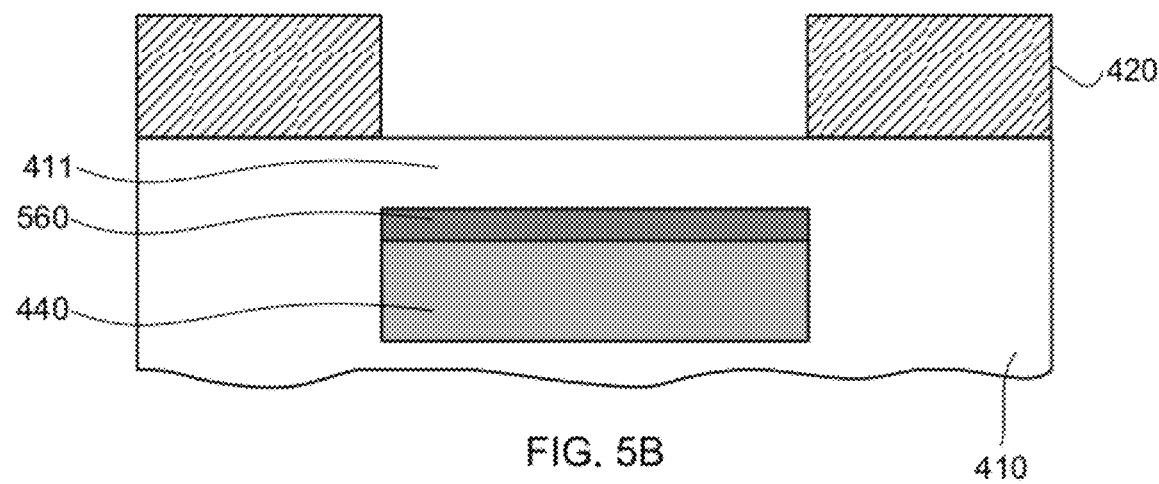
Figure 5C:
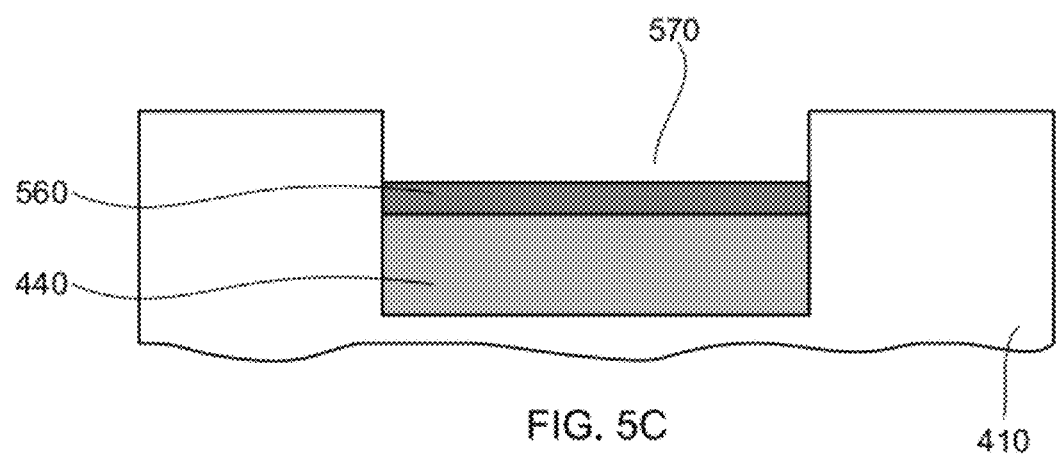

As noted above, in the method of FIG. 3, the metal ions can alternatively be implanted adjacent to embedded structure 440 during step 340. For example, as illustrated in FIG. 5A, layer 550 of metal ions may instead be implanted immediately above structure 440. During the additional processing of step 350, e.g., during an anneal step, the metal ions of layer 550 may diffuse towards or concentrate at or near the interface between embedded structure 440 and layer 550, forming layer 560 of reduced thickness relative to layer 550. Such a concentration/diffusion step can alternatively be omitted. Layer 560 may be used as it is, or alternatively may be exposed by removing portion 411 of the substrate overlying embedded structure 440, as illustrated in FIG. 5C. Suitable methods for removing such a substrate portion are described, for example, in U.S. Pat. No. 7,419,915, entitled "Laser Assisted Chemical Etching Method For Release Microscale and Nanoscale Devices," the entire contents of which are incorporated by reference herein.

Figure 5D:
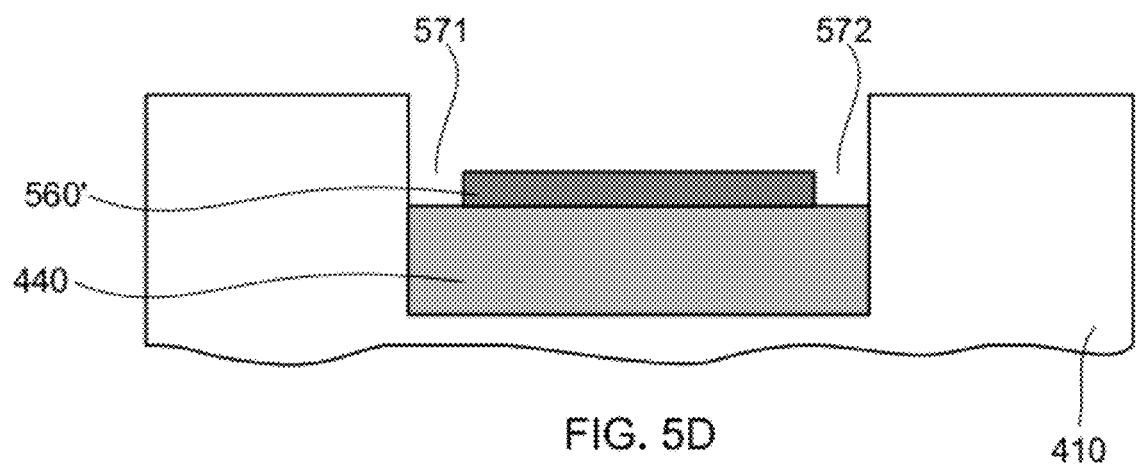
Figure 5E:
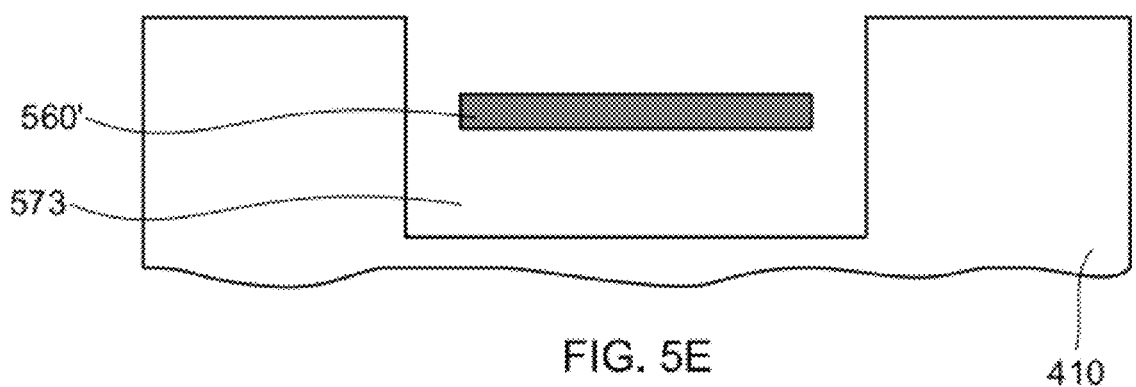
Figure 5F:
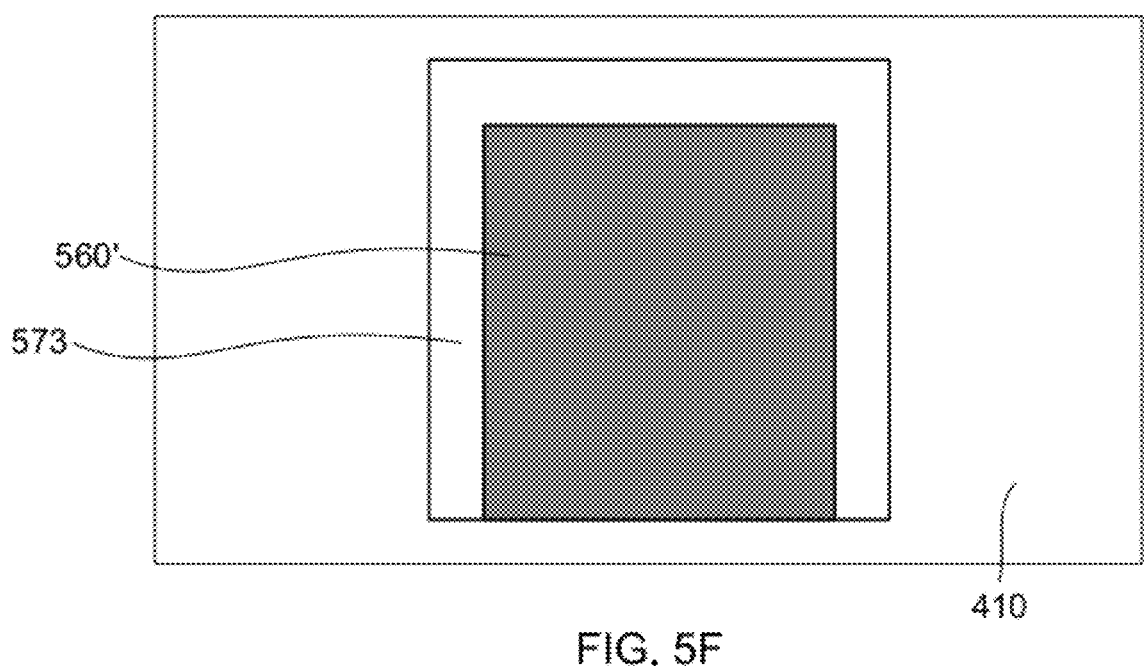
FIG. 5F illustrates a plan view of the alternative structure of FIG. 5E, according to some embodiments.

If desired, layer 560 further may be freed from embedded structure 440 by cutting along one or more of its edges, e.g., using mechanical or laser-based cutting. For example, as illustrated in FIG. 5D, layer 560 may be cut along two or more of its edges, forming cavities 571 and 572 on either side of layer 560' having reduced lateral size as compared to layer 560. Additionally, if desired, embedded structure 440 may be removed, e.g., using conventional etching techniques, forming cavity 573 and freeing layer 560' partially or entirely from substrate 410, as illustrated in FIG. 5E. As illustrated in FIG. 5F, layer 560' optionally may be cut along three of its four edges, leaving it connected along one edge to substrate 410, and otherwise surrounded by cavity 573.

In one embodiment of the structure illustrated in FIGS. 5E-5F, substrate 410 includes Si, the first ion type is O, embedded structure 440 includes an $SiO_2$ layer, and the metal ion type is Al. During the anneal step, the Al in layer 550 coalesces into a substantially continuous, electrically conductive aluminum layer 560 adjacent to the upper surface of embedded structure 440. Conventionally, the aluminum would instead be expected to diffuse through the thickness of substrate 410. However, the presence of the $SiO_2$ layer inhibits the diffusion of the aluminum into the substrate, which is a perturbed arrangement. Note that films comprising metal need not necessarily be partially or entirely freed from substrate 410.

Figure 6A:
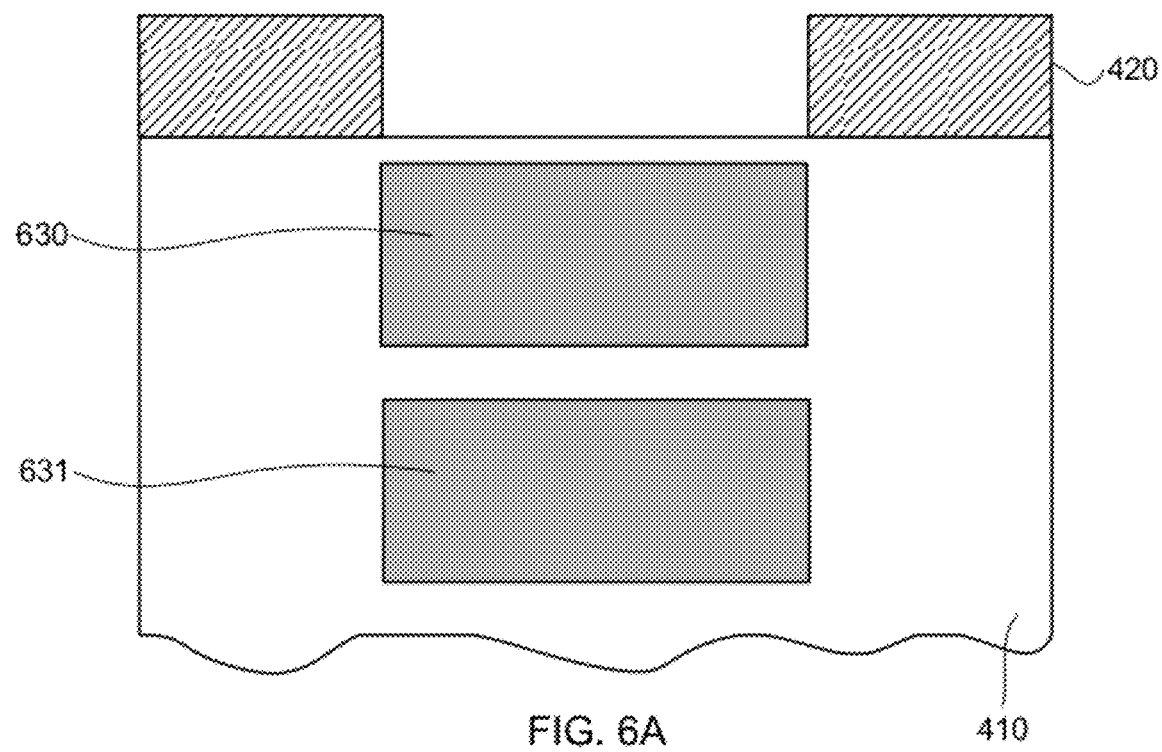
FIGS. 6A-6D illustrate cross-sectional views of alternative structures that may be formed while preparing a film using sequential ion implantation, according to some embodiments.
Figure 6B:
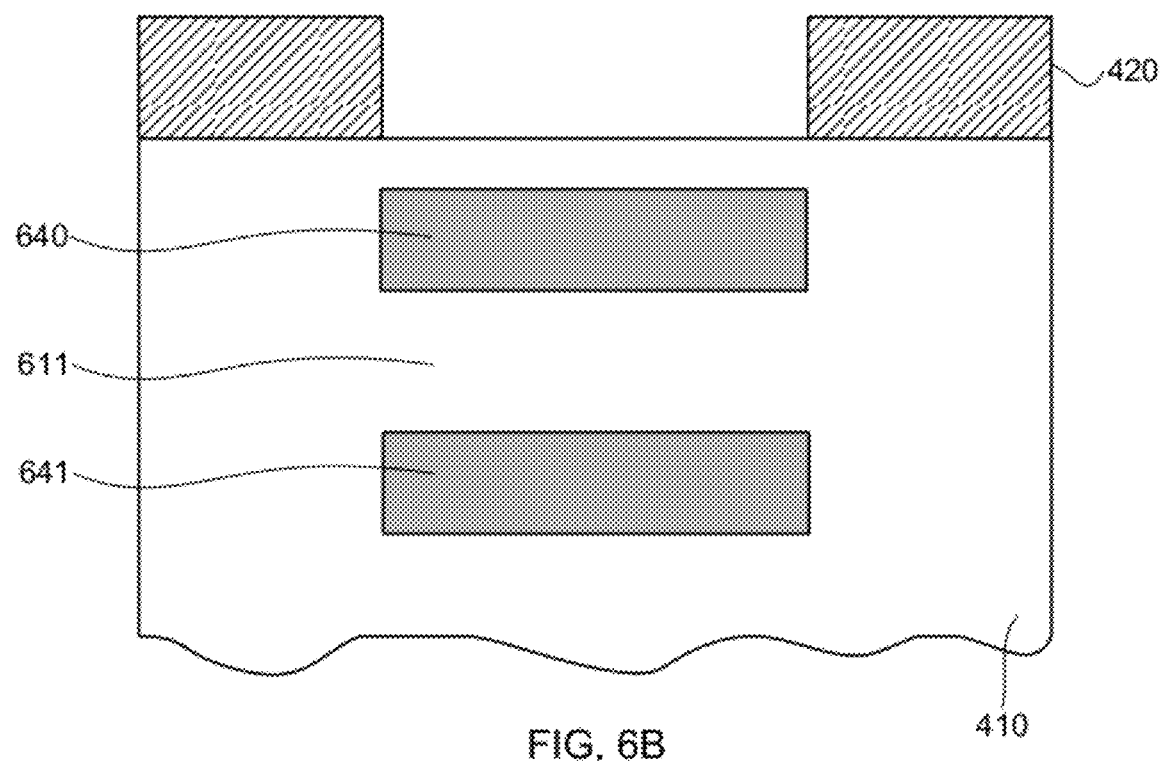
Figure 6C:
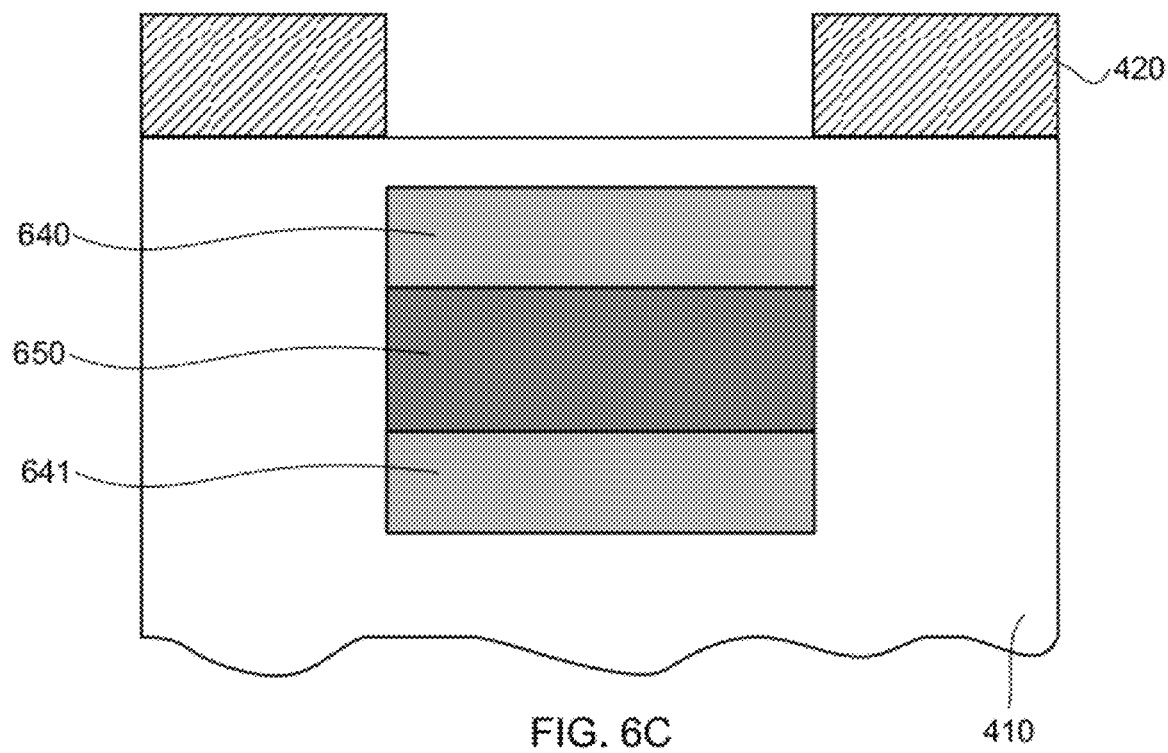
Figure 6D:
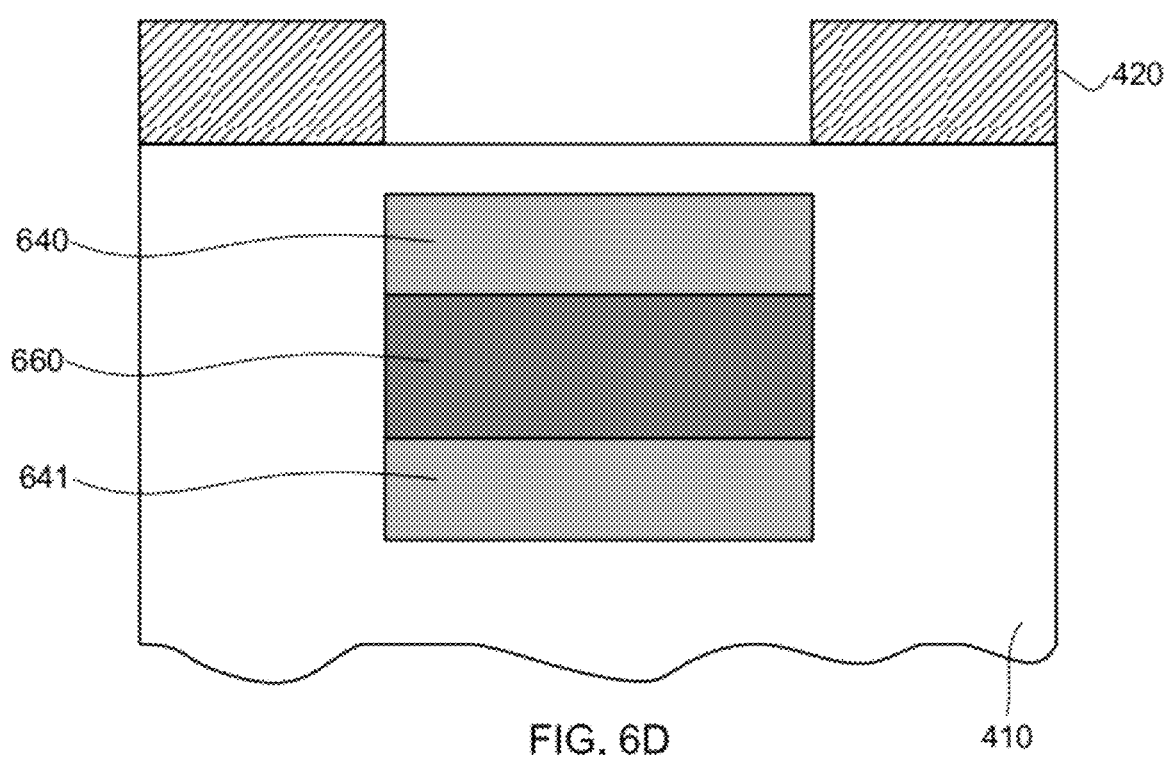

The method of FIG. 3 may also be modified to prepare more complex structures. For example, as illustrated in FIG. 6A, two separate layers 630, 631 may be formed, instead of single layer 430 illustrated in FIG. 4B. The two layers 630, 631 may be formed, for example, by implanting ions of a first type at two different energies, the difference between the energies being sufficiently great to form two separate structures having approximately the same chemical potential as one another. As illustrated in FIG. 6B, during additional processing, such as an anneal, the ions in layers 630, 631 may concentrate to form two embedded structures 640, 641, thus increasing the thickness of substrate portion 611 disposed between layers 640, 641. As illustrated in FIG. 6C, metal ions then may be implanted into substrate portion 611, between and adjacent to structures 640, 641. Layers 640, 641 may constrain the metal ions 650, causing them to assume a perturbed arrangement, such as coalescing into a substantially continuous metal film, or such as bonding to the portion of substrate 611, to form layer 660, illustrated in FIG. 6D. In one example, the substrate includes Si, the first ion type is O, embedded structures 640, 641 include $SiO_2$, and the metal ion type is Al. The Al forms a substantially continuous, electrically conductive film 660 sandwiched between layers 640, 641.

Figure 7A:
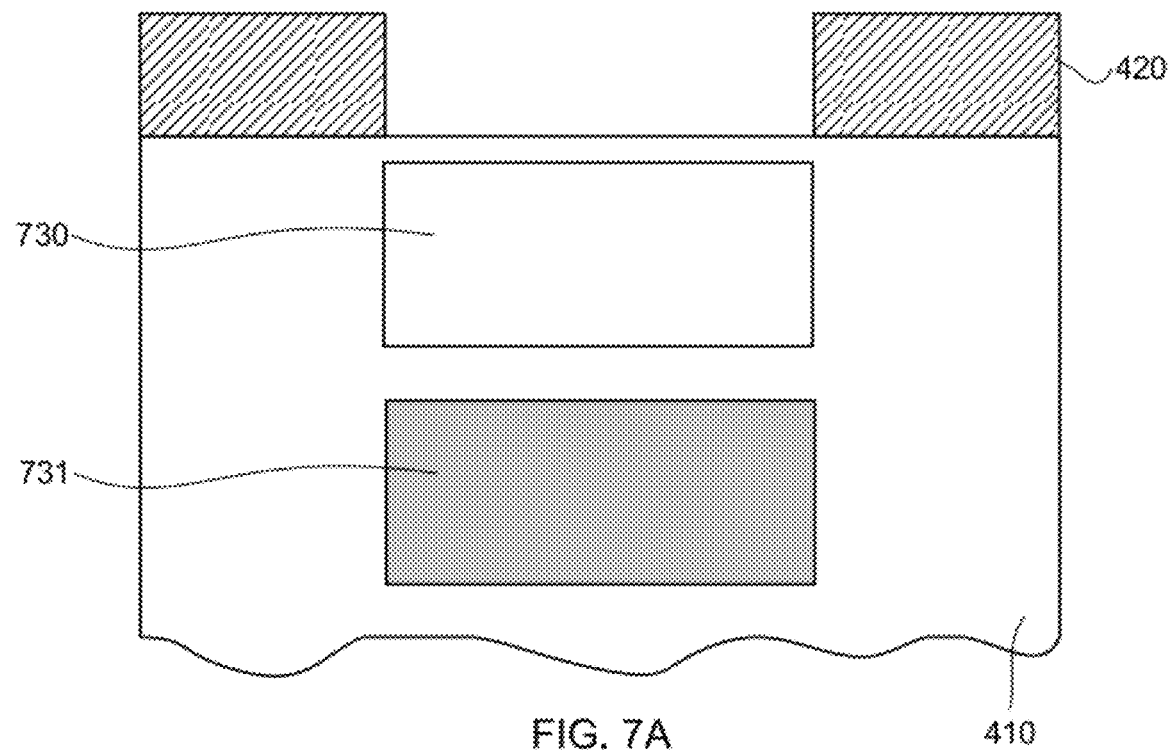
FIGS. 7A-7D illustrate cross-sectional views of alternative structures that may be formed while preparing a film using sequential ion implantation, according to some embodiments.
Figure 7B:
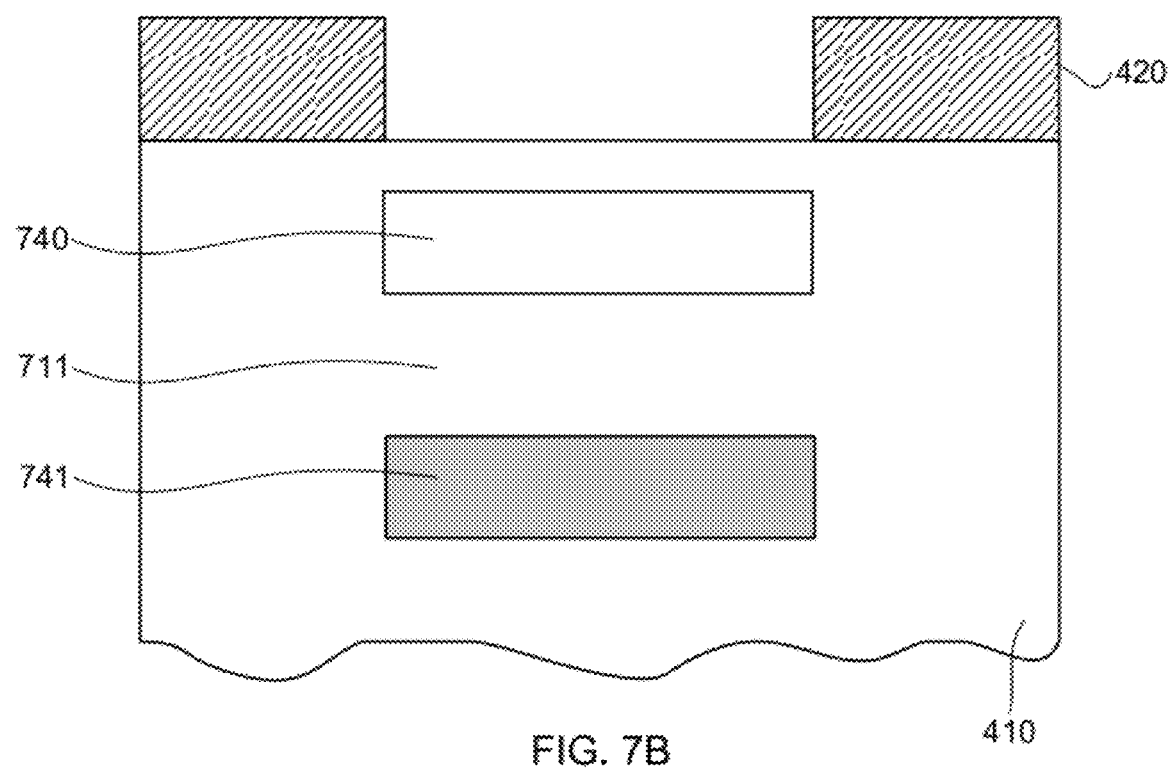
Figure 7C:
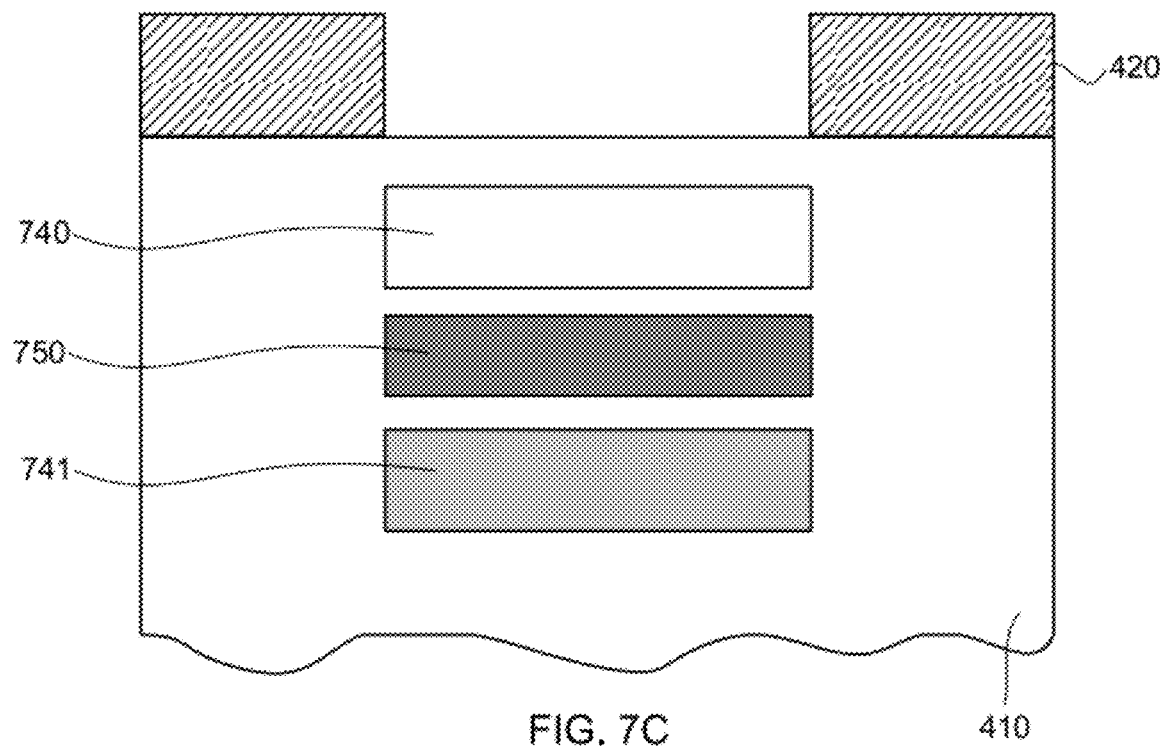
Figure 7D:
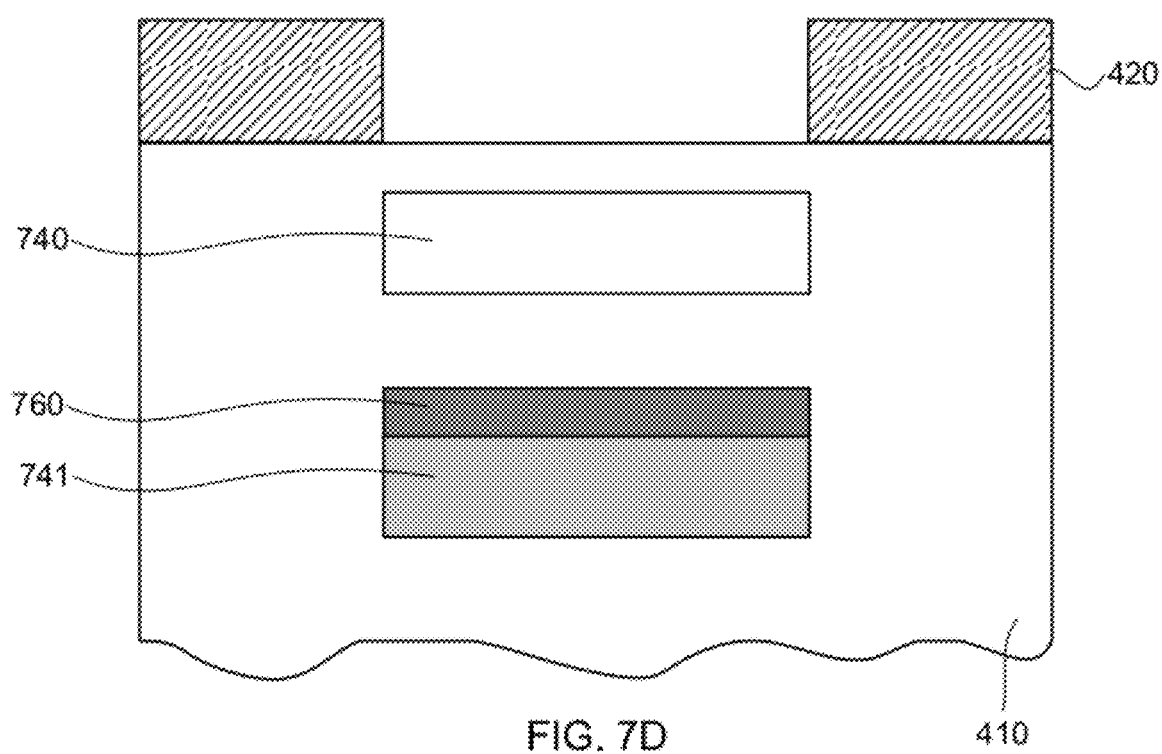

In still another alternative embodiment, as illustrated in FIG. 7A, two separate layers 730, 731 may be formed using different materials, resulting in the two layers having different chemical potentials than one another. The two layers 730, 731 may be formed, for example, by implanting ions of a first type at a first energy to form layer 730, and implanting ions of a second type at a second energy to form layer 731. As illustrated in FIG. 7B, during additional processing, such as an anneal, the ions in layers 730, 731 may concentrate to form two embedded structures 740, 741. As illustrated in FIG. 7C, metal ions then may be implanted into substrate portion 711, optionally at a spaced distance from one or both of embedded structures 740, 741. The difference in chemical potential between structures 740, 741 controls the diffusion of the metal ions, e.g., by causing the metal ions to directionally diffuse toward the lower-potential embedded structure (structure 741, in this example), a perturbed arrangement. Such diffusion optionally may be promoted with annealing. Following such diffusion, the metal ions may coalesce into a substantially continuous metal film 760, as illustrated in FIG. 7D, or may bond to the portion of substrate 711.

Figure 8:
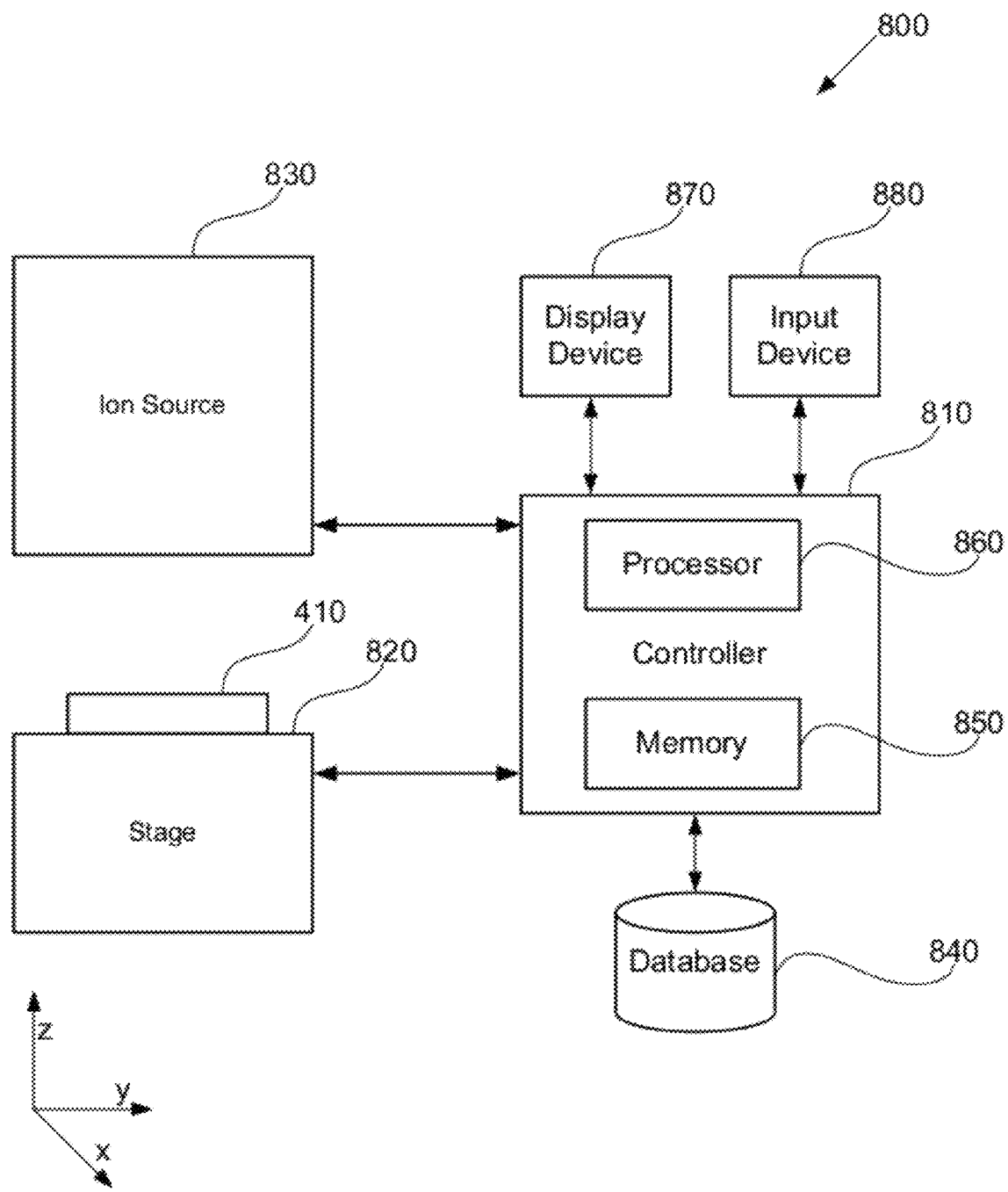
FIG. 8 schematically illustrates a system for preparing a film using sequential ion implantation, according to some embodiments.

FIG. 8 illustrates a system 800 for use in preparing films using sequential ion implantation, according to some embodiments. System 800 includes controller 810, stage 820, ion source 830, and database 840. Controller 810 is in operable communication with stage 820, ion source 830, and database 840. Controller 810 includes memory 850 for storing processing instructions, processor 860 for executing the stored processing instructions, display 870 for displaying data to a user, and input device 880 for accepting input from a user. Database 840 contains information on how to prepare a variety of different types of films using sequential ion implantation. Database 840 may be integral to controller 810, or may be remote to controller 810 and in operable communication with controller 810 via a network, such as the Internet. Stage 820 supports substrate 410, and is operable to adjust the position of the substrate in the x, y, and z directions responsive to instructions from controller 810, as well as to heat substrate 410 to a desired temperature. Ion source 830 emits ions of the first type, and metal ions, at pre-selected energies and doses responsive to instructions from controller 810, each optionally in accordance with a pre-selected pattern, if such patterns are desired and a mask is not provided on the substrate.

Responsive to user input provided through input device 880, e.g., user input defining a desired type of film or structure to be prepared, controller 810 requests database 840 to provide information on how to prepare that type of film. Responsive to the request, database 840 provides some or all of the following information to the controller 810: the type of substrate to be used; any required preparation thereof; the types of ions to be used; the energies, doses, and optional patterns with which the ions respectively are to be implanted; the temperatures to which substrate 810 is to be heated during each implantation and processing step; and any additional processing to be performed after implanting the ions. Controller 810 receives this information and stores it in memory 850. Processor 860 processes the stored information, and based on that information displays instructions to the user via display device 870 and controls stage 820 and ion source 830 to process the substrate 410 as appropriate.

In one example, the user uses input device 880, e.g., a keyboard and mouse, to input to the controller that he desires to prepare a film comprising metal such as illustrated in FIG. 5C. Responsive to that input, controller 810 requests database 840 to provide information on preparing such a film. Responsive to the request, database 840 provides a set of instructions to the controller 810, which controller 810 stores in memory 850. Processor 860 then processes the stored instructions to determine what information is to be displayed to the user via display device 870, and how the stage 820 and ion source 830 are to be controlled. For example, processor 860 determines, based on the stored instructions, that substrate 410 is to be an Si wafer, and that mask 420 (not illustrated in FIG. 8) is to be provided thereon. Processor 860 then causes this information to be displayed to the user via display device 870 so that the user may separately obtain the Si substrate and provide mask 420 thereon (step 320 in FIG. 3).

Next, the user places the prepared Si substrate 410 on stage 820, and uses input device 880 to inform controller 810 that the substrate is ready. Responsive to this input, processor 860 instructs stage 820 to move to a pre-determined position in the x, y, and z direction for ion implantation and to heat substrate 410 to a pre-determined temperature, based on the stored instructions. Processor 860 then instructs ion source 830 to implant the ions of the first type, such as O, at the dose and energy defined in the stored instructions (step 331 in FIG. 3). Then, depending on the further processing defined in the stored instructions (step 332 in FIG. 3), processor 860 may display instructions to the user using display device 770 regarding any steps the user is to perform, such as providing a different mask (not required for preparing the film of FIG. 5C), and/or may control stage 820 to perform one or more steps as appropriate, such as annealing substrate 410 to form an embedded layer of $SiO_2$.

Processor 860 then instructs stage 820 to heat substrate 410 to a pre-determined temperature, and instructs ion source 830 to implant the metal ions, such as Al, at the dose and energy defined in the stored instructions (step 340 in FIG. 3). Heating in this, and other heating/annealing steps described herein, may alternatively be accomplished in other ways. For example, a laser may be used to heat selected regions of the substrate by focusing the laser beam onto those regions of the substrate. Electron beams and ion beams may also be used to heat selected regions of the substrate.

Then, depending on the further processing defined in the stored instructions (step 350 in FIG. 3), processor 860 may display instructions to the user 870 regarding any steps the user is to perform, such as removing mask 420 on substrate 410 or removing substrate portion 411 or the $SiO_2$ layer, and/or may control stage 820 to perform one or more steps as appropriate, such as annealing substrate 410.

Those of skill in the art will appreciate that any of the user-performed steps may alternatively be automated using commercially available equipment (not illustrated). For example, instead of displaying to the user what type of substrate and mask is to be provided, controller 810 may instead be in operable communication with a robotic substrate handler that may obtain substrate 410 from a substrate store, and may process the substrate as required to provide the mask 420. In one embodiment, one or more steps of an instruction sequence are made contingent on a feedback parameter. For example, the characteristics of the substrate may change as different steps (e.g., heating, ion implantation, etching), and these changes may be automatically characterized, for example using spectroscopy. The system may include instructions to move to a different step in the process after a pre-determined change to the substrate is characterized.

The present invention further provides methods for preparing free-standing films comprising metal, and free-standing films formed using the same. FIGS. 9A-9D illustrate cross-sectional views of structures that may be formed while preparing an exemplary free-standing film comprising metal using laser-assisted chemical etch (LACE) methods such as described in U.S. Pat. Nos. 7,419,915 and 7,419,917 and in U.S. patent application Ser. No. 12/869,597, filed Aug. 26, 2010, the entire contents of each of which are incorporated by reference herein.

Figure 9A:
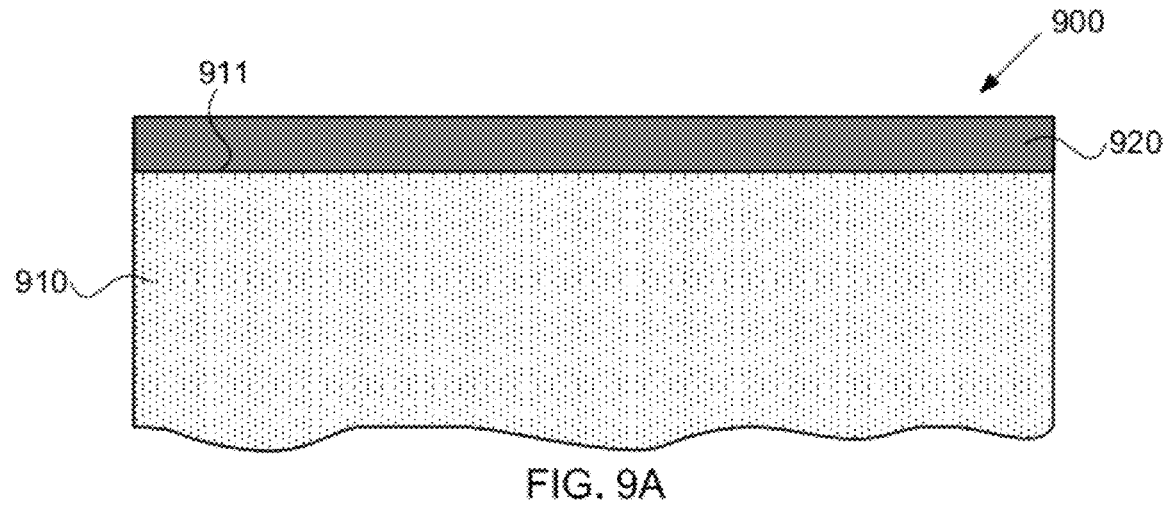
FIGS. 9A-9D illustrate cross-sectional views of exemplary structures that may be formed while preparing a free-standing film using laser-assisted chemical etch.

FIG. 9A illustrates precursor structure 900, which includes substrate 910 having upper surface 911, and film 920 disposed on the upper surface 911 of substrate 910. Substrate 910 may be similar to substrate 210 of FIGS. 2A-2C or substrate 410 of FIGS. 4A-6D and may be a bulk substrate, such as a semiconductor wafer, optionally having one or more unpatterned and/or patterned films deposited thereon. For example, substrate 910 may include one or more conductor layers, and/or one or more semiconductor layers, and/or one or more insulator layers (not shown) beneath upper surface 911, as well as any suitable support for such layers. Examples of suitable substrates include, but are not limited to, silicon (Si), germanium (Ge), gallium phosphide (GaP), gallium nitride (GaN), gallium arsenide (GaAs), and indium phosphide (InP). In one embodiment, the substrate is an Si wafer.

Film 920 is disposed on at least a portion of substrate upper surface 911. In the illustrated embodiment, film 920 covers substantially the entire upper surface 911 of substrate 910, while in other embodiments (similar to embodiments described above with respect to FIGS. 4A-6D), film 920 is patterned so as to cover only a portion of the upper surface 911 of substrate 910. Film 920 comprises metal, e.g., aluminum, and has a chemical composition suitable for the intended purpose of the free-standing film, e.g., film 920 is an electrically conductive layer. The chemical composition of film 920 also preferably is compatible with the processing parameters to be used to form a cavity in substrate 910 beneath film 920. Additionally, in some embodiments, the thickness of film 920 is selected such that a sufficient amount of a suitable chemical etchant may diffuse through the film so as to etch substrate 910 on a practical laboratory timeframe, e.g., within less than 24 hours, or within less than 12 hours, or within less than 6 hours, or within less than 2 hours, or within less than 1 hour, or within less than 20 minutes. Film 920 is also at least partially transparent to the wavelength of laser light to be used to enhance the rate of reaction between the etchant and substrate 910.

Figure 9B:
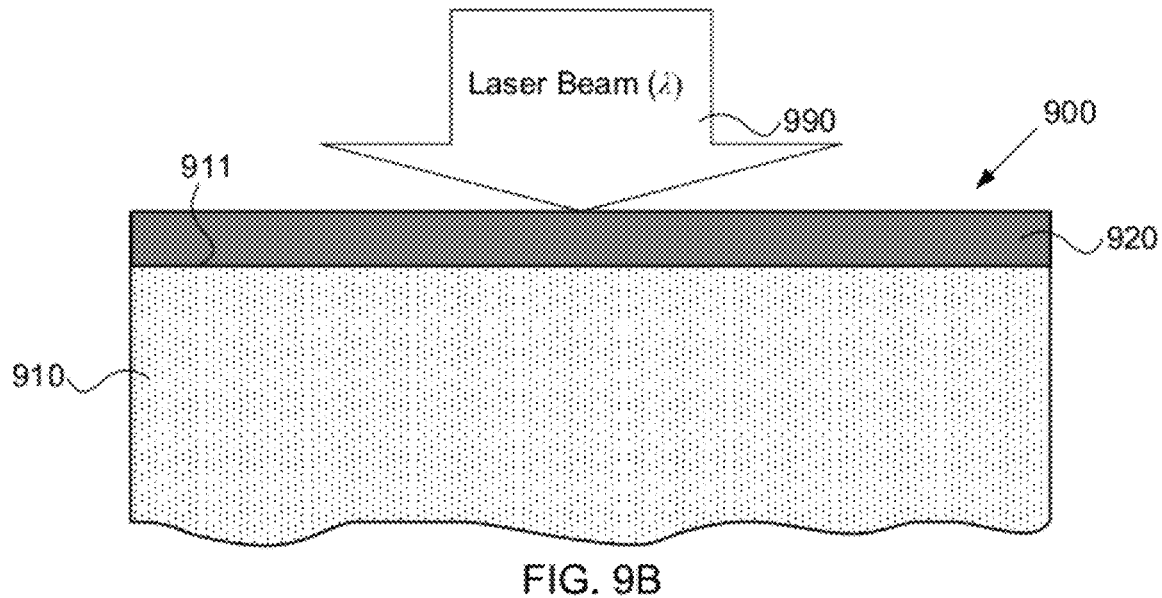

Referring to FIG. 9B, precursor structure 900 is exposed to a chemical etchant (not shown), such as gaseous chlorine ($Cl_2$), and to laser beam 990, i.e., is exposed to a LACE process. The laser beam 990 and chemical etchant preferably are co-selected to etch substrate 910 selectively relative to film 920. For example, one or more wavelengths ($\lambda$) of light in the laser beam 990 may be relatively strongly absorbed by the substrate 910 as compared to film 920, resulting in selective heating of substrate 920 that speeds the reaction of the etchant with the substrate. Other light-based mechanisms for selectively enhancing the reaction of the etchant with the substrate also may suitably be used.

Figure 9C:
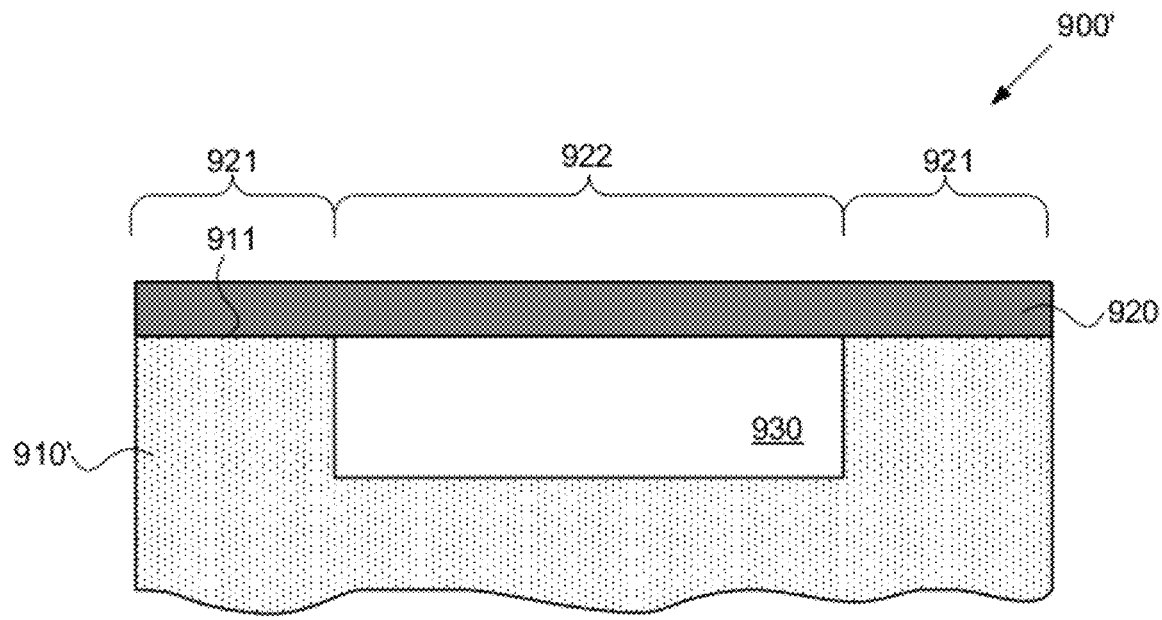

As illustrated in FIG. 9C, exposure to the chemical etchant and laser beam 990 forms structure 900', which includes modified substrate 910' having cavity 930 formed therein. Cavity 930 has a substantially uniform depth defined by the duration of exposure to the chemical etchant and laser beam 990. In the illustrated embodiment, the lateral extent of cavity 930 is defined by the lateral extent of laser beam 990. However, in other embodiments, laser beam 990 may be rastered (scanned) across substrate 920 to form a cavity 930 having lateral dimensions defined by the spatial extents of beam 990 and the lateral dimensions along which the beam was rastered. Such rastering may also be used to prepare multiple cavities in substrate 920 beneath film 920, although only one such cavity 930 is illustrated in FIG. 9C.

In one embodiment, film 920 of structure 900' has substantially the same thickness, continuity, and composition as it did in structure 900, that is, before exposure to the etchant and laser beam 990. In alternative embodiments, film 920 of structure 900 is initially too thick to permit the etchant to sufficiently diffuse through the film to reach substrate 910, and/or is initially too thick to permit sufficient laser light to penetrate through the film to reach substrate 910, on a practical timeframe. In such embodiments, the chemical etchant and/or the laser light may etch film 920 until the film becomes sufficiently thin for the etchant and/or laser light to reach substrate 910, at which point the etchant preferentially etches the substrate 910 relative to film 920. In either of the two embodiments, however, film 920 preferably remains substantially continuous during exposure to the chemical etchant and laser beam. The reaction products may diffuse through film 920 during processing, or a pressure relief channel may be provided in the substrate, as described in greater detail below.

Figure 9D:
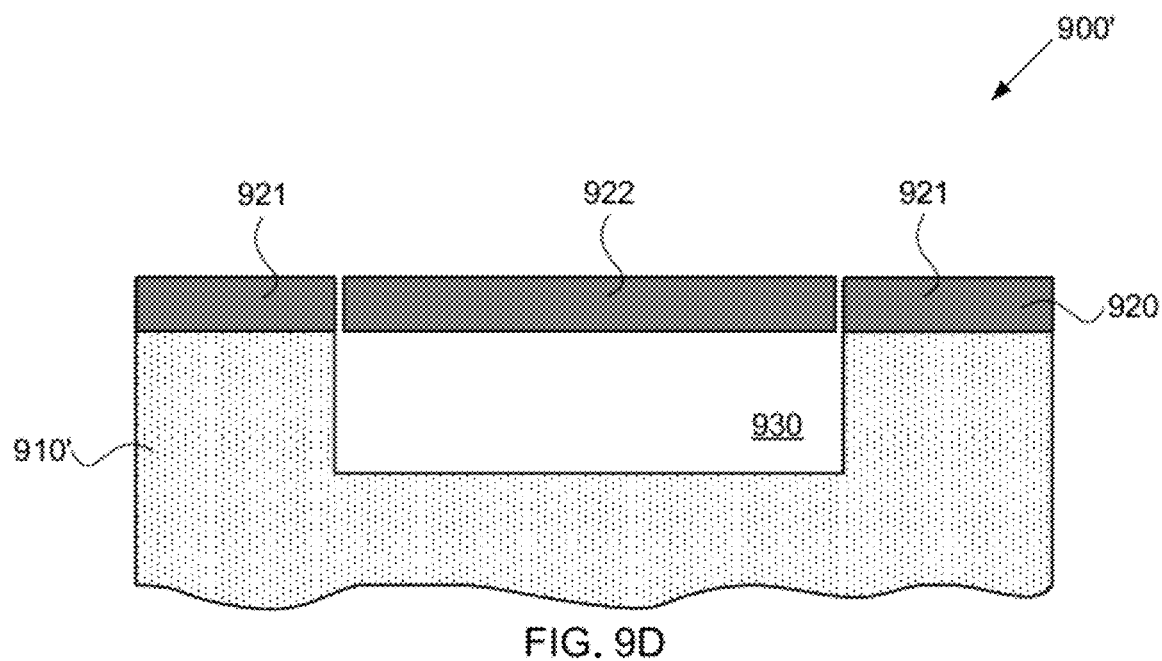

As illustrated in FIG. 9C, following the LACE process, one or more portions 921 of film 920 remain disposed on the upper surface 911 of substrate 910', while another portion 922 of film 920 is suspended over cavity 930. Film portion 922 is considered to be "free-standing" because it has substantially no supporting structure directly underneath it. Instead, free-standing film portion 922 is suspended over cavity 930, and held in place via portion 922's physical connections to portions 921. Free-standing film portion 922 optionally may be partially or completely freed from structure 900', e.g., using a free-ion beam (FIB) or other suitable technique known in the art, such as mechanical or laser-based cutting, to sever the physical connection(s) between free-standing portion 922 and one or both of portions 921. For example, as illustrated in FIG. 9D, free-standing portion 922 is entirely severed from portions 921 and may be physically removed from structure 900'.

Figure 10A:
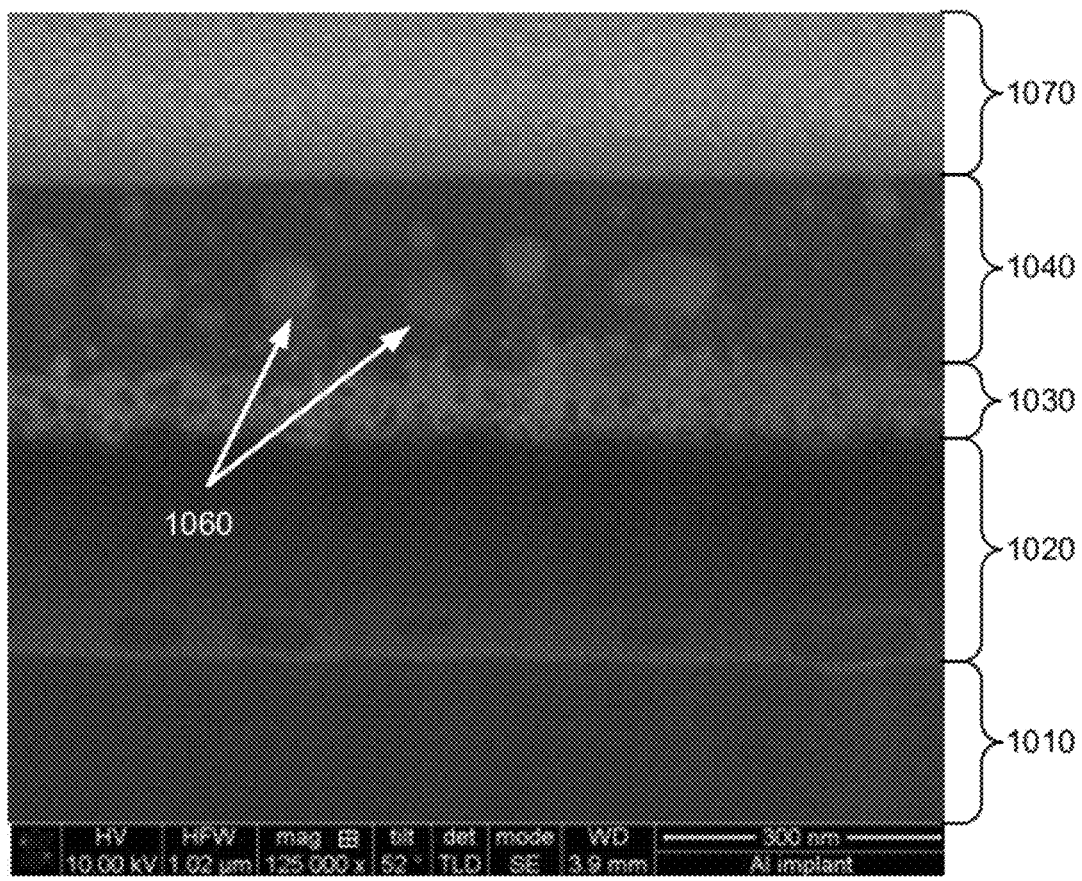
FIGS. 10A-10D are SEM images of exemplary buried films comprising metal prepared using the method of FIG. 3.

FIG. 10A is a scanning electron microscope (SEM) image of an exemplary buried film comprising metal prepared using the method of FIG. 3. The image shows Si wafer 1010 having $SiO_2$ embedded structure 1020, buried aluminum film 1030, and an overlying Si layer 1040 that contains nodules 1060. Such nodules may be pure or substantially pure aluminum, or some combination of aluminum and silicon. Advantageously, buried film 1030 is substantially continuous. It may be noted from FIG. 10A that aluminum film 1030 appears somewhat spongy or porous; however, it is believed that notwithstanding the pores, aluminum film 1030 provides a substantially continuous conductive pathway within Si wafer 1010. It is not believed that the presence of nodules 1060 would interfere with the use of aluminum film 1030 as a conductive layer. Layer 1070 is a platinum layer added to the sample following ion implantation, to facilitate SEM imaging.

Figure 10B:
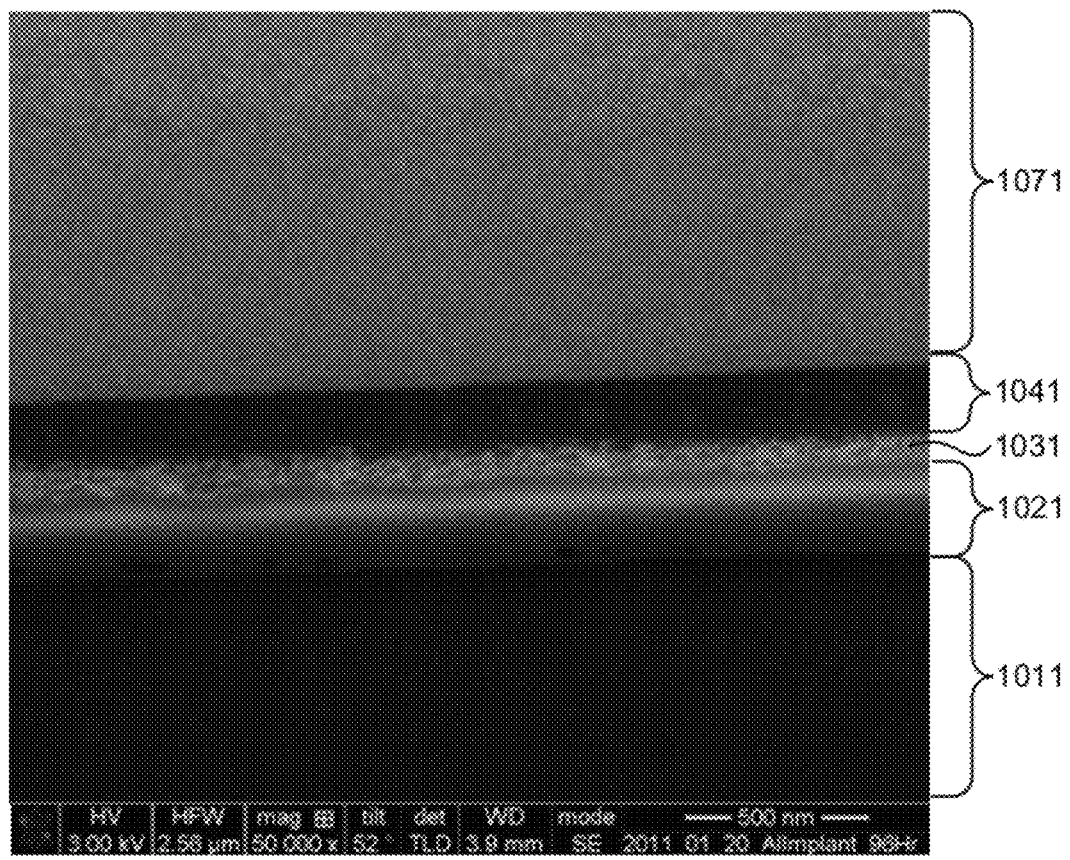
Figure 10C:
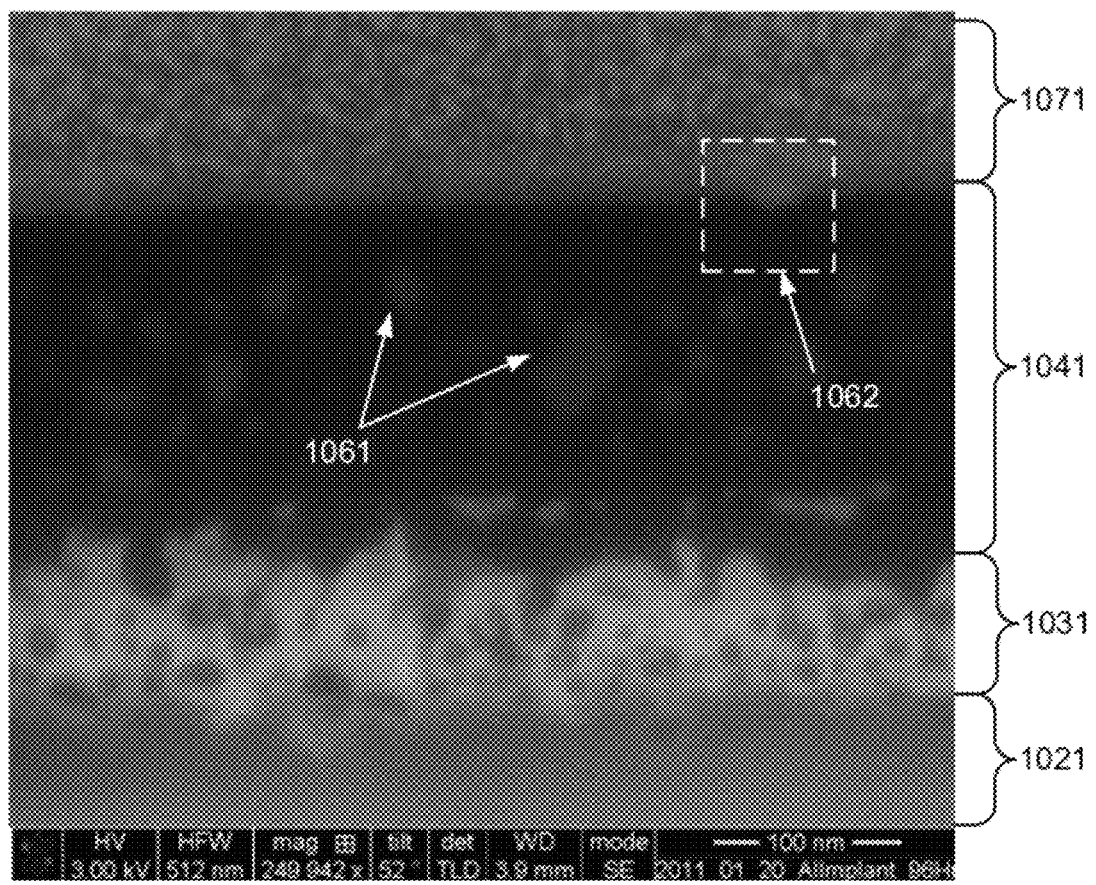
Figure 10D:
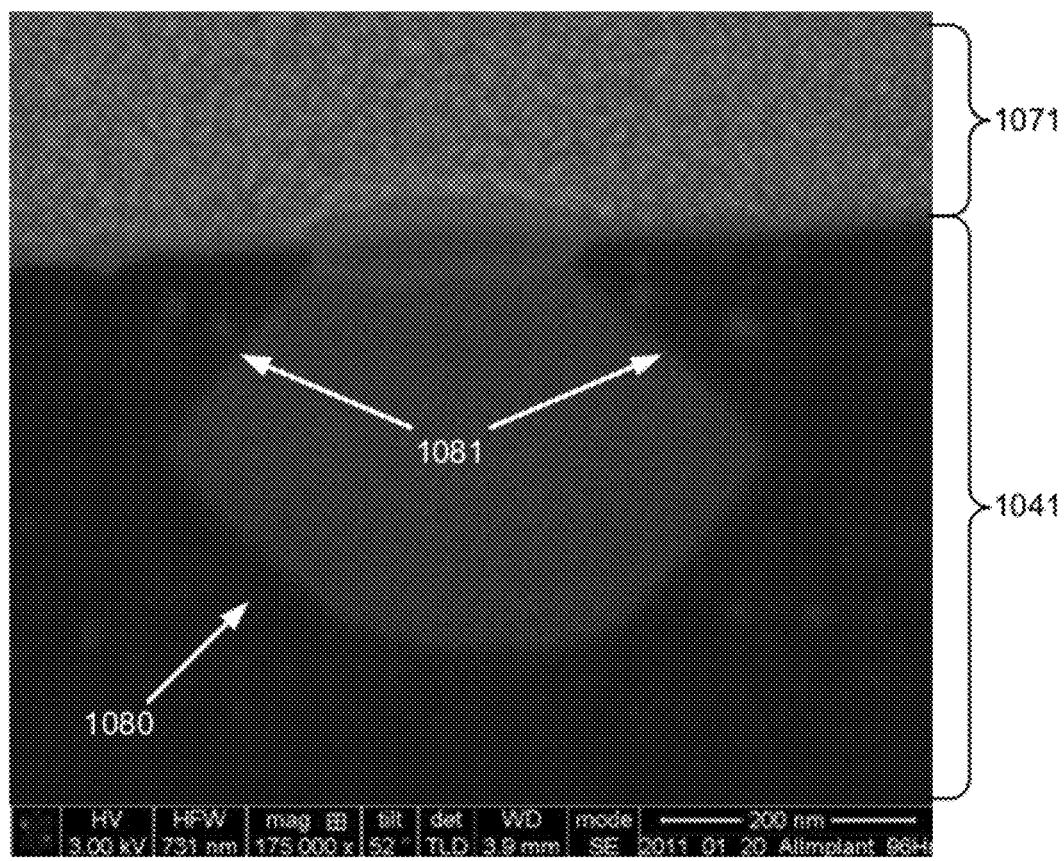

Without wishing to be bound by any theory, it is believed that with further processing, e.g., annealing, nodules 1060 would diffuse into and become a part of buried film 1030. FIGS. 10B-10D are SEM images of a sample prepared similarly to that of FIG. 10A, but further subjected to 96 hours of annealing at 500° C. after ion implantation. As can be seen from FIG. 10B, annealed aluminum layer 1031 appears somewhat brighter than does the analogous layer in FIG. 10A, while annealed substrate 1011, annealed $SiO_2$ embedded structure 1020, and annealed overlying Si layer 1041 appear somewhat darker than do the analogous layers in FIG. 10A. Without wishing to be bound by any theory, it is believed that annealing the sample caused aluminum layer 1031 to densify relative to that in the non-annealed sample, resulting in layer 1031 appearing brighter in FIG. 10B and increasing the overall contrast of the image. Layer 1071 is a platinum layer added following the ion implantation, again to facilitate SEM imaging.

FIG. 10C is a closer view of the same sample as shown in FIG. 10B. It may be seen that aluminum layer 1031 still appears spongy or porous, although it is believed that the layer may be somewhat less spongy or porous than aluminum layer 1030 in the non-annealed sample shown in FIG. 10A, as evidenced by the apparently brighter appearance of aluminum layer 1031. Additionally, nodules 1061 may be seen in FIG. 10C to be somewhat dimmer than nodules 1060 shown in FIG. 10A. As for FIG. 10A, it is believed that these nodules 1061 may contain aluminum, e.g., pure or substantially pure aluminum, or some mixture of aluminum and silicon. It may be noted that nodules 1061 in the annealed sample of FIG. 10C have a somewhat dimmer appearance than do nodules 1060 in the non-annealed sample of FIG. 10A. Without wishing to be bound by any theory, it is believed that nodules 1061 may appear dimmer because of the increased relative brightness of aluminum layer 1031 following annealing, and/or because of the transport of aluminum out of those nodules and into aluminum layer 1031.

That nodules 1061 have undergone a physical transformation as a result of the anneal is supported by FIG. 10D, which shows a closer view of region 1062 illustrated in FIG. 10C. As shown in FIG. 10D, nodule 1080 is positioned near the interface between platinum layer 1071 and Si layer 1041. Nodule 1080 may be seen to have approximately straight sides 1081. Without wishing to be bound by any theory, it is believed that straight sides 1081 reflect that nodule 1080 has a specified crystallographic phase. Additionally, referring again to FIG. 10C, it appears that nodules 1061 may also be somewhat more angular, and smaller, than nodules 1060 shown in FIG. 10A, which appear to be more rounded. The more angular and smaller appearance of nodules 1061 shown in FIG. 10C, and the straight sides 1081 of nodule 1080 shown in FIG. 10D, suggest that the annealing process may facilitate transport of aluminum within or even out of the nodules, and may also facilitate the arrangement of material in the nodules into a specific crystallographic phase.

Figure 11A:
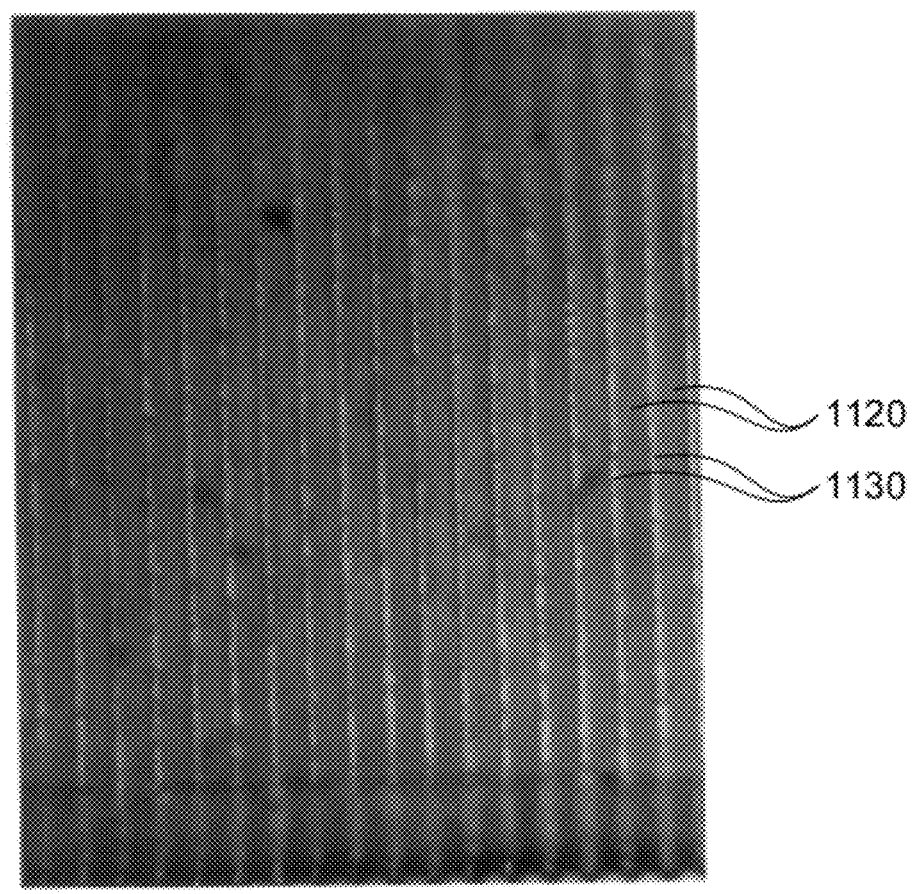
FIG. 11A is a microscope image of an exemplary structure prepared using the method of FIG. 3.
Figure 11B:
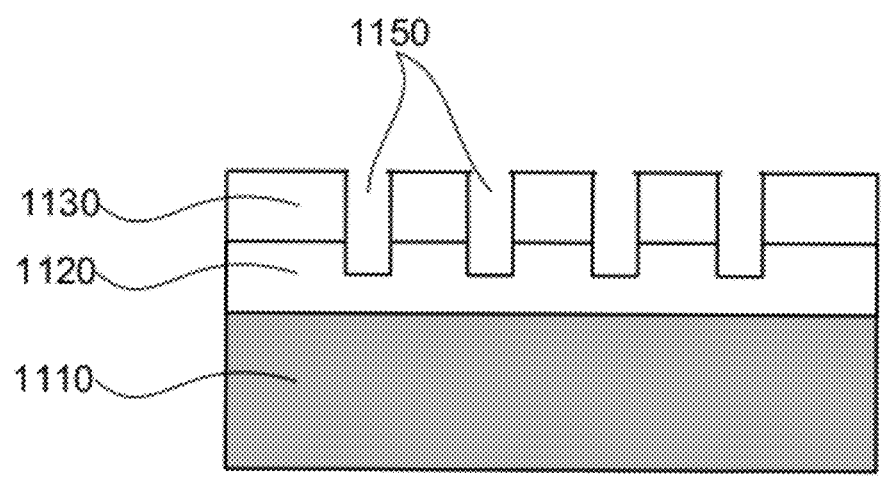
FIG. 11B schematically illustrates a cross-section of the structure of FIG. 11A.

FIG. 11A is a microscope image of an exemplary structure prepared using the method of FIG. 3, and FIG. 11B is a cross-sectional schematic view of the structure of FIG. 11A. Silicon oxide embedded structure 1120 was implanted in silicon substrate 1110 using ion implantation of oxygen ions, followed by annealing. Aluminum ions were then implanted above and adjacent to the silicon oxide layer, to create a buried aluminum film sandwiched between the silicon oxide layer and an overlying portion of the substrate. The overlying portion of the substrate was then removed using the laser-assisted chemical etch (LACE) methods described above and in U.S. Pat. No. 7,419,915, to expose the aluminum film.

Next, the aluminum film and a portion of the silicon oxide layer were patterned using LACE to define cavities 1150, yielding an aluminum grating 1130 disposed over partially patterned silicon oxide layer 1120.

Figure 12A:
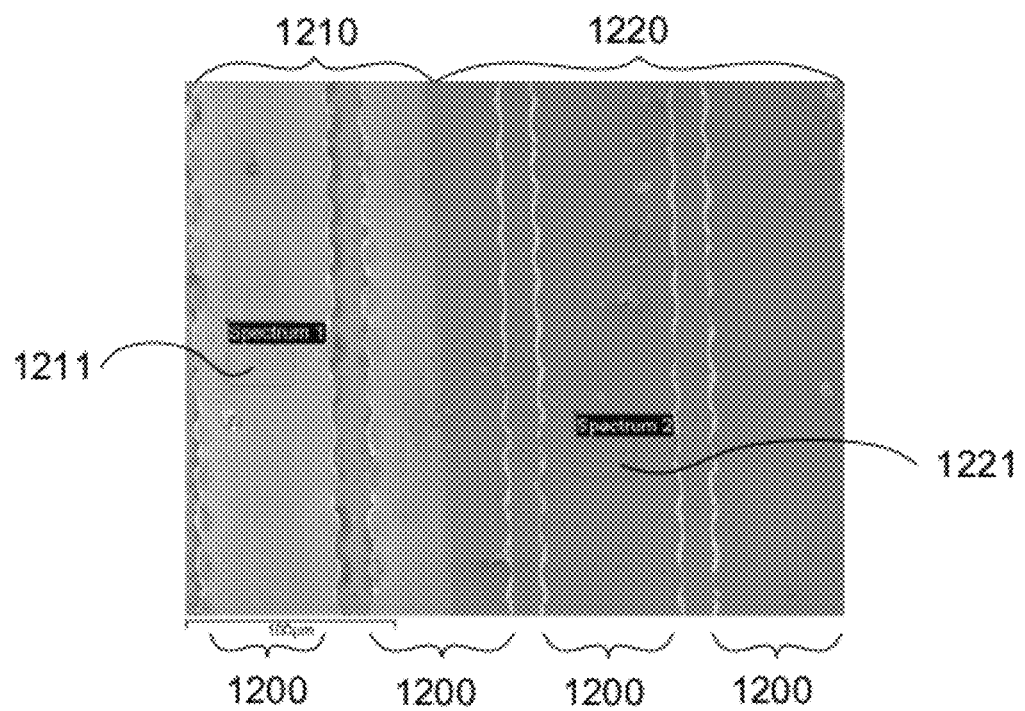
FIG. 12A is a SEM image of another exemplary structure prepared using the method of FIG. 3.
Figure 12B:
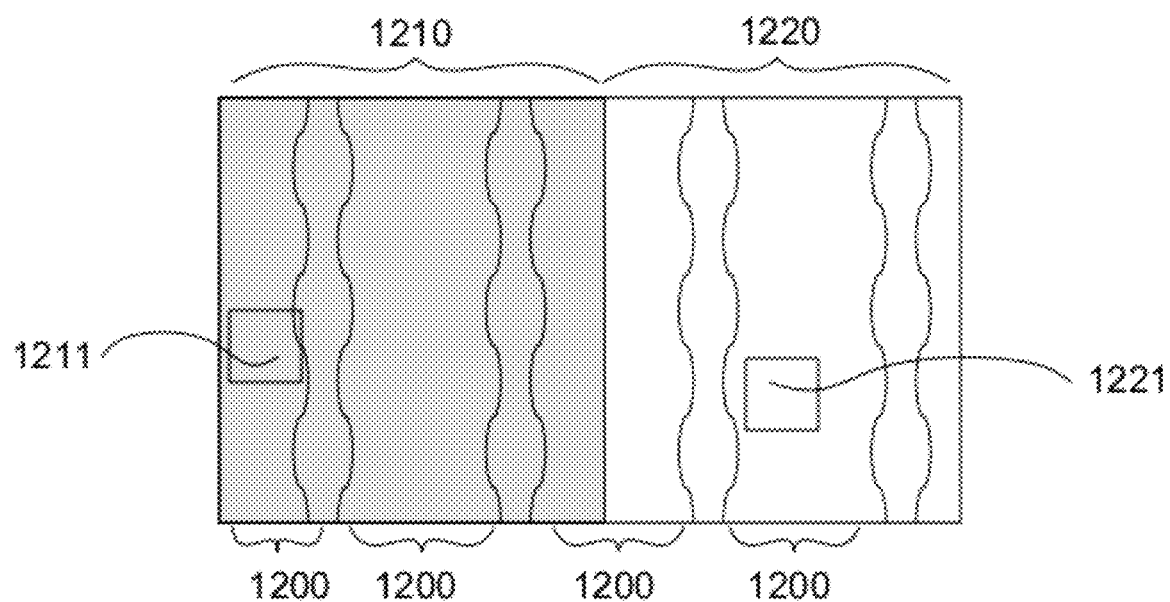
FIG. 12B schematically illustrates a plan view of the structure of FIG. 12A.

FIG. 12A is a SEM image of another exemplary structure prepared using the method of FIG. 3, and FIG. 12B schematically illustrates a plan view of the structure of FIG. 12A. Oxygen ions were implanted within a silicon wafer at regions 1200 to create patterned, buried silicon oxide embedded structures. Aluminum ions were implanted within the silicon wafer above the patterned silicon oxide layer, to create a buried aluminum film sandwiched between the patterned silicon oxide layer and an overlying portion of the silicon substrate. This overlying portion of the silicon substrate was then removed in region 1210 using LACE methods such as described above and in U.S. Pat. No. 7,419,915. The silicon layer in region 1220 was not processed using LACE and, thus, was not removed.

The composition of the structure of FIG. 12A was assessed by obtaining energy dispersive analysis X-ray (EDAX) spectra at points 1211 and 1221, which respectively correspond to points at which the overlying portion of the silicon substrate was, or was not, removed. These EDAX spectra were obtained concurrently with the SEM image of FIG. 12A. Specifically, the SEM microscope was used to excite the electrons at points 1211 and 1221, ejecting some of the film's inner-shell electrons and creating holes. Electrons from higher-energy shells in the film then filled the holes, and the difference in energy between the higher- and lower-energy shells caused the release of X-rays. The number and energies of the X-rays thus released was captured by an energy dispersive spectrometer. Based on the energies of the captured X-rays, the elements of the film at points 1211 and 1221 were deduced.

Figure 12C:
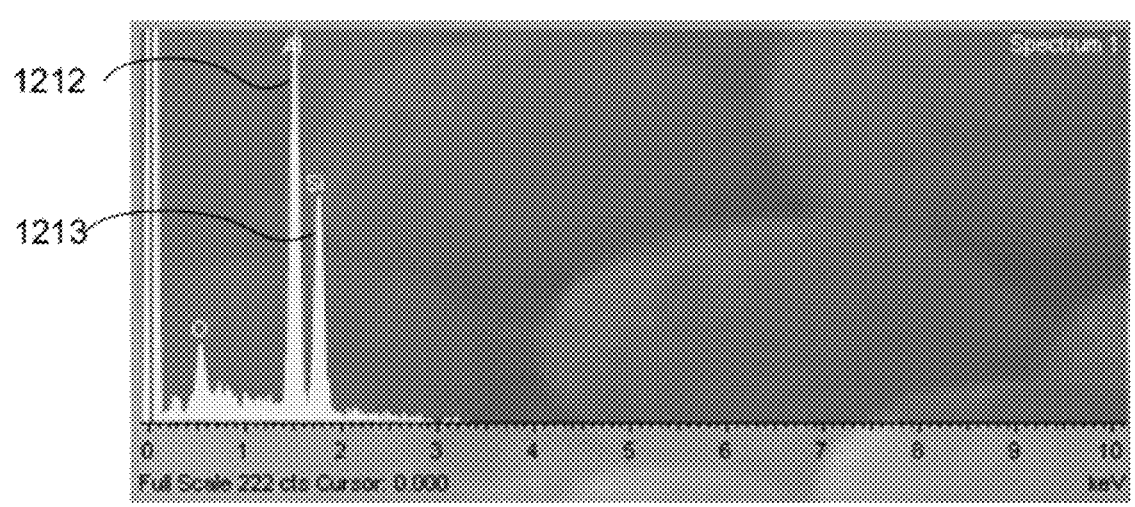
FIGS. 12C-12D are energy dispersive analysis X-ray (EDAX) spectra of the structure of FIG. 12A.

FIG. 12C illustrates the EDAX spectrum at point 1211, where the portion of the silicon substrate overlying the aluminum film had been removed using LACE. This EDAS spectrum includes two large peaks at 1212 and 1213, and numerous smaller peaks. Based on the energies, it was determined that the peak at 1212 corresponds to X-rays generated by Al and the peak at 1213 corresponds to X-rays generated by Si. Based on the relative magnitudes of peaks 1212 and 1213, it is believed that the film is composed predominantly of Al. It is believed that the Si peak is from a region under the buried film comprising aluminum. Trace signal contributions from O and other elements may also be seen.

Figure 12D:
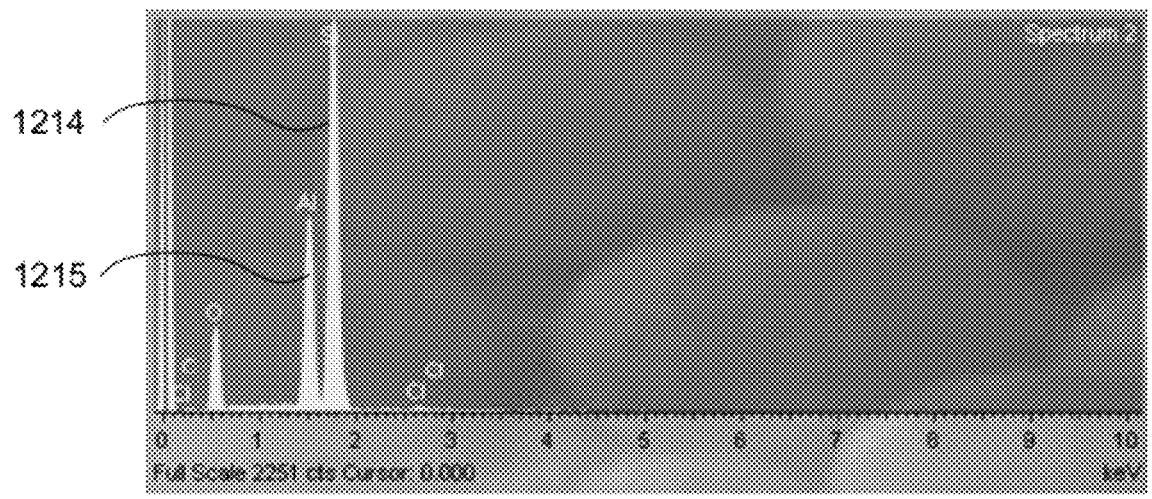

FIG. 12D illustrates the EDAX spectrum at point 1221, where the portion of the silicon substrate overlying the aluminum film had not been removed. This EDAS spectrum includes two large peaks at 1214 and 1215, and numerous smaller peaks. Based on the energies, it was determined that the peak at 1214 corresponds to X-rays generated by Al and the peak at 1215 corresponds to X-rays generated by Si. Unlike the EDAX spectrum of FIG. 12C, in which the largest peak corresponds to Al, here the largest peak corresponds to Si because the silicon was not removed by LACE at point 1221. Signal contributions from the underlying Al film, as well as from other elements, may also be seen.

Other modifications to the diffusion and/or reaction kinetics of metal ions than those described herein may be used. Also, although most of the embodiments described herein utilize sequential implantation of two different types of ions, it is clear that three or more different types of ions can be sequentially implanted to prepare films having still further tailored properties, or to prepare multiple films, each having tailored properties.

Although various embodiments of the invention are described herein, it will be evident to one skilled in the art that various changes and modifications may be made without departing from the invention. It is intended in the appended claims to cover all such changes and modifications that fall within the true spirit and scope of the invention.

What is claimed is:

1. An ion-implanted structure comprising:
a substrate comprising a first material;
an embedded structure comprising a second material embedded within the first material of the substrate; and
a substantially continuous film comprising metal implanted within the first material of the substrate, disposed within the second material of the embedded structure or immediately adjacent to and contacting the second material of the embedded structure.

2. The ion-implanted structure of claim 1, wherein the second material of the embedded structure controls diffusion of the metal through the first material of the substrate.

3. The ion-implanted structure of claim 1, wherein the second material of the embedded structure controls reactivity of the metal within the first material of the substrate.

4. The ion-implanted structure of claim 1, wherein the metal diffuses through the first material of the substrate in the absence of the second material of the embedded structure.

5. The ion-implanted structure of claim 1, wherein the second material of the embedded structure comprises $SiO_2$, the first material of the substrate comprises Si, and the metal comprises Al.

6. The ion-implanted structure of claim wherein the metal has a pre-selected phase.

7. The ion-implanted structure of claim 1, wherein a cavity defined in the first material of the substrate exposes a portion of the substantially continuous film comprising metal.

8. The ion-implanted structure of claim 1, wherein the film is formed by implanting ions of the metal at a first energy.

9. The ion-implanted structure of claim 8, wherein the substrate is annealed after implanting.

10. The ion-implanted structure of claim 8, further comprising a second film formed by implanting metal into the substrate at a second energy different from the first energy.

11. The ion-implanted structure of claim 10, wherein the substantially continuous film comprises a first metal and the second film comprises a second metal.

12. The ion-implanted structure of claim 1, wherein the metal is selected from the group consisting of Al, Au, Ag, Mn, Cu, Pt, Li, Na, K, and Rb.

13. The ion-implanted structure of claim 1, wherein the substantially continuous film comprising metal is electrically conductive.

14. The ion-implanted structure of claim 1, wherein the substantially continuous film comprising metal is patterned.

15. An ion-implanted structure comprising:
a substrate;
an embedded structure embedded within the substrate; and
a substantially continuous film comprising metal implanted within the substrate, disposed within the embedded structure or immediately adjacent to and contacting the embedded structure, wherein a cavity defined in the substrate exposes a portion of the embedded structure.

16. An ion-implanted structure comprising:
a substrate comprising a first material;
an embedded structure comprising a second material embedded within the first material of the substrate; and
a film comprising metal embedded within the first material of the substrate, disposed within the second material of the embedded structure or immediately adjacent to and contacting the second material of the embedded structure,
wherein a cavity defined in the first material of the substrate is disposed beneath the film comprising metal.

* * * * *